(12) United States Patent
Uchida et al.

(10) Patent No.: US 11,024,706 B2
(45) Date of Patent: Jun. 1, 2021

(54) SEMICONDUCTOR DEVICE

(71) Applicant: Panasonic Intellectual Property Management Co., Ltd., Osaka (JP)

(72) Inventors: Masao Uchida, Osaka (JP); Kouichi Saitou, Toyama (JP); Takashi Hasegawa, Toyama (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 27 days.

(21) Appl. No.: 16/726,982

(22) Filed: Dec. 26, 2019

(65) Prior Publication Data
US 2020/0266268 A1 Aug. 20, 2020

(30) Foreign Application Priority Data
Feb. 19, 2019 (JP) .............................. JP2019-027639

(51) Int. Cl.
*H01L 29/06* (2006.01)
*H01L 29/47* (2006.01)
*H01L 29/16* (2006.01)

(52) U.S. Cl.
CPC ...... *H01L 29/0619* (2013.01); *H01L 29/1608* (2013.01); *H01L 29/47* (2013.01)

(58) Field of Classification Search
CPC .. H01L 29/0619; H01L 29/1608; H01L 29/47
See application file for complete search history.

(56) References Cited

U.S. PATENT DOCUMENTS

| | | | |
|---|---|---|---|
| 2014/0093881 A1* | 4/2014 | Sugnet | H03M 7/30 435/6.12 |
| 2017/0263697 A1 | 9/2017 | Maeyama et al. | |

FOREIGN PATENT DOCUMENTS

JP 6030806 B 11/2016

* cited by examiner

*Primary Examiner* — Thomas L Dickey
(74) *Attorney, Agent, or Firm* — McDermott Will & Emery LLP

(57) ABSTRACT

A semiconductor device includes a silicon carbide semiconductor layer, a termination region disposed in the silicon carbide semiconductor layer, an insulating film covering part of the termination region, an electrode disposed on the silicon carbide semiconductor layer, a seal ring disposed on remaining part of the termination region and surrounding the electrode, and a passivation film covering the insulating film and the seal ring. Assuming that an outer peripheral end of the seal ring and an outer peripheral end of the passivation film have distance L2 at a side of the silicon carbide semiconductor layer, the outer peripheral end of the seal ring and the outer peripheral end of the passivation film have distance L1 at a corner, and the outer peripheral end of the passivation film at the corner has radius of curvature R1, L1>L2 and R1≥L2 are satisfied.

7 Claims, 29 Drawing Sheets

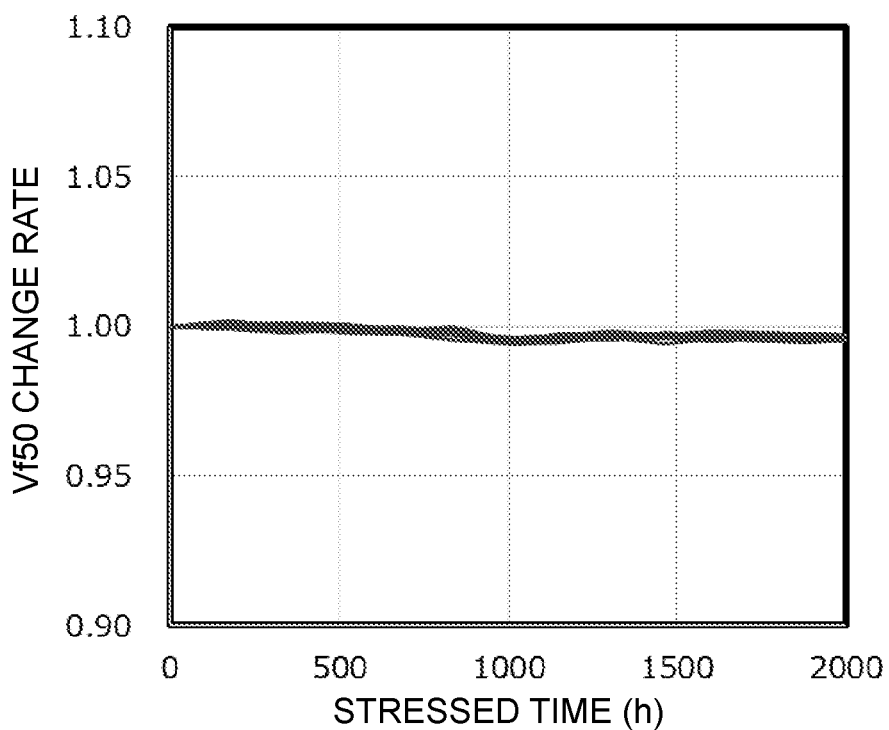
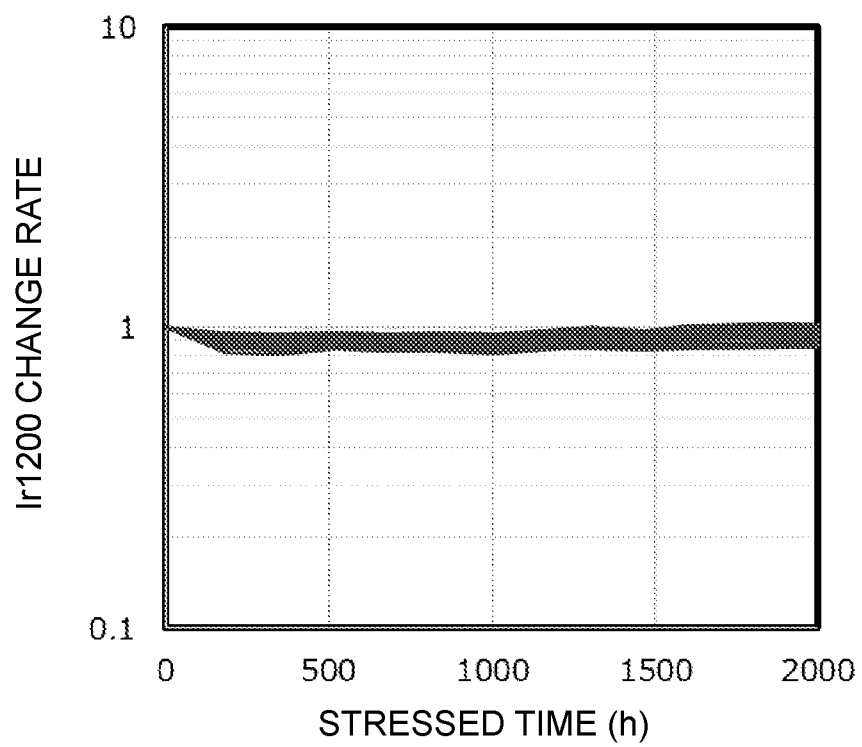

SEMICONDUCTOR DEVICE

BACKGROUND

1. Technical Field

The present disclosure relates to a semiconductor device.

2. Description of the Related Art

Silicon carbide (SiC) is a semiconductor material larger in band gap and higher in hardness than silicon (Si). SiC is applied to a semiconductor device such as a switching device and a rectifier device. The semiconductor device made of SiC advantageously achieves reduction in power loss in comparison to the semiconductor device made of Si.

Typical examples of a semiconductor device made of SiC include a metal-insulator-semiconductor field-effect transistor (MISFET) and a Schottky-barrier diode (SBD). Examples of the MISFET include a metal-oxide-semiconductor field-effect transistor (MOSFET). Examples of the SBD include a junction-barrier Schottky diode (JBS).

The semiconductor device made of SiC (hereinafter, called an "SiC semiconductor device") includes a semiconductor substrate and a semiconductor layer disposed on a principal surface of the semiconductor substrate and made of SiC. Above the semiconductor layer, there is disposed an electrode electrically connected to a device exterior and functioning as a front surface electrode. The semiconductor layer has a terminal structure for field relaxation, at a terminal end or a periphery of the SiC semiconductor device. The semiconductor layer may also have an annular layer disposed on a principal surface at an end of the semiconductor layer and enhancing humidity resistance. When the semiconductor device is packaged or made a module, a passivation film is disposed to cover the terminal structure for inhibition of structure breakdown due to interference by a resin covering the semiconductor device (see PTL 1).

CITATION LIST

Patent Literature

PTL 1: Japanese Patent Publication No. 6030806

SUMMARY

The present disclosure provides a semiconductor device according to an aspect, achieving high breakdown voltage and high reliability.

In order to achieve this object, the semiconductor device according to the aspect of the present disclosure includes a semiconductor substrate, a silicon carbide semiconductor layer, a termination region, an insulating film, a first electrode, a second electrode, a seal ring, and a passivation film. The semiconductor substrate has a principal surface and a rear surface, and is of a certain conductivity type. The silicon carbide semiconductor layer is disposed on the principal surface of the semiconductor substrate and is of a certain conductivity type. The termination region is disposed in the silicon carbide semiconductor layer and surrounds a center region in the silicon carbide semiconductor layer. The insulating film covers part of the termination region and exposes remaining part of the termination region. The first electrode is disposed on at least part of the center region in the silicon carbide semiconductor layer. The second electrode is disposed on the rear surface of the semiconductor substrate, and the second electrode and the semiconductor substrate form an ohmic contact. The seal ring is disposed on the remaining part of the termination region and surrounds the first electrode. The passivation film covers at least part of the insulating film and at least part of the seal ring, and includes an organic film. When viewed in a direction perpendicular to the principal surface of the semiconductor substrate, the passivation film has an outer peripheral end surrounding an outer peripheral end of the seal ring, and the silicon carbide semiconductor layer has a quadrilateral shape. Assume that the outer peripheral end of the seal ring and the outer peripheral end of the passivation film have distance L2 at a side of the silicon carbide semiconductor layer. Assume that the outer peripheral end of the seal ring and the outer peripheral end of the passivation film have distance L1 at a corner of the silicon carbide semiconductor layer. Assume that the outer peripheral end of the passivation film has radius of curvature R1 at the corner of the silicon carbide semiconductor layer. In this case, L1>L2 and R1≥L2 are satisfied.

According to the aspect of the present disclosure, the semiconductor device achieves high breakdown voltage and high reliability.

BRIEF DESCRIPTION OF THE DRAWINGS

FIG. 7A is a graph of an HTRB evaluation result of semiconductor device 1000 according to the exemplary embodiment of the present disclosure, indicating a change rate of Vf50;

FIG. 7B is a graph of the HTRB evaluation result of semiconductor device 1000 according to the exemplary embodiment of the present disclosure, indicating a change rate of Ir1200;

DETAILED DESCRIPTION

Figure 1:
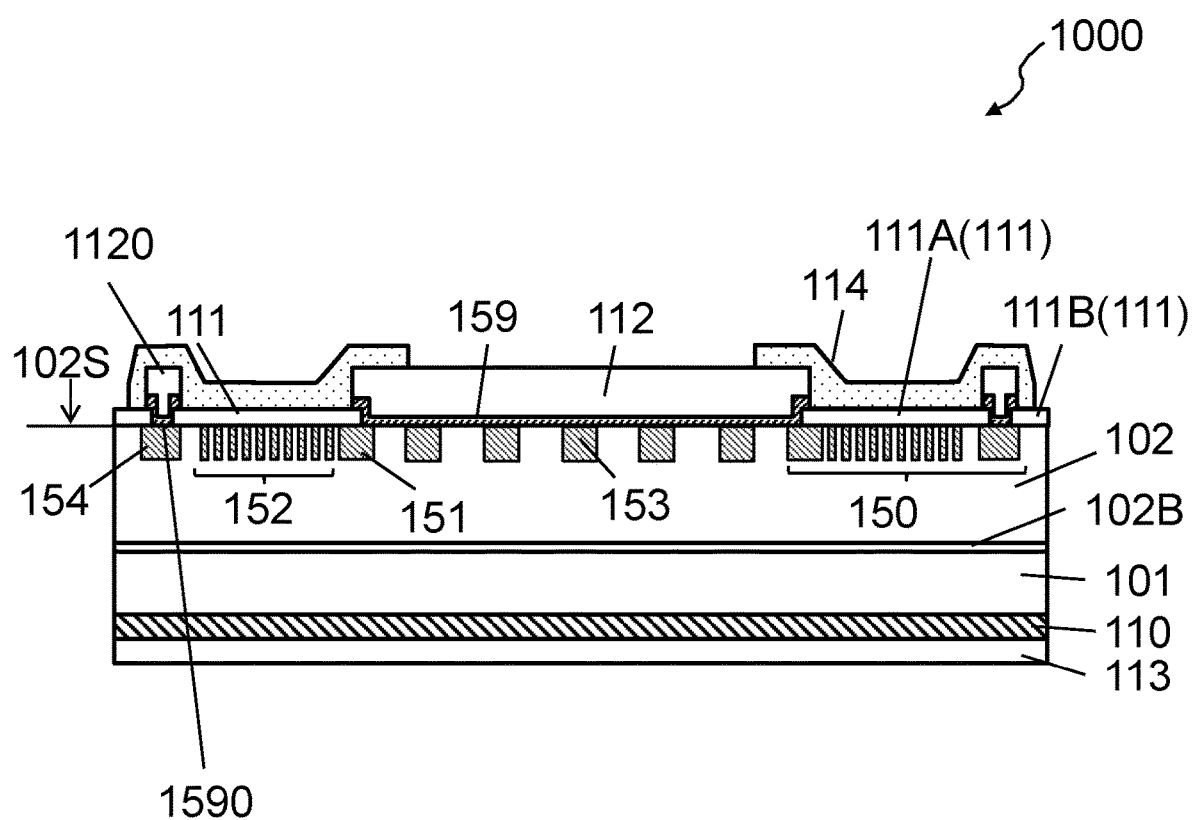
FIG. 1 is a sectional view of semiconductor device 1000 according to an exemplary embodiment of the present disclosure.

There has been demanded a highly reliable semiconductor device that is durable against high voltage and large current.

The conventional SiC semiconductor device disclosed in PTL 1 may fail to achieve sufficient reliability. In view of the above, the inventors have devised a semiconductor device and a method of producing the semiconductor device according to the following aspect.

A semiconductor device according to an aspect of the present disclosure includes a semiconductor substrate, a silicon carbide semiconductor layer, a termination region, an insulating film, a first electrode, a second electrode, a seal ring, and a passivation film. The semiconductor substrate has a principal surface and a rear surface, and is of a first conductivity type. The silicon carbide semiconductor layer is disposed on the principal surface of the semiconductor substrate and is of the first conductivity type. The termination region is disposed in the silicon carbide semiconductor layer, surrounds a center region in the silicon carbide semiconductor layer, and is of a second conductivity type. The insulating film covers part of the termination region and exposes remaining part of the termination region. The first electrode is disposed on at least part of the center region in the silicon carbide semiconductor layer. The second electrode is disposed on the rear surface of the semiconductor substrate, and the second electrode and the semiconductor substrate form an ohmic contact. The seal ring is disposed on the remaining part of the termination region and surrounds the first electrode. The passivation film covers at least part of the insulating film and at least part of the seal ring, and includes an organic film. When viewed in a direction perpendicular to the principal surface of the semiconductor substrate, the passivation film has an outer peripheral end surrounding an outer peripheral end of the seal ring, and the silicon carbide semiconductor layer has a quadrilateral shape. Assume that the outer peripheral end of the seal ring and the outer peripheral end of the passivation film have distance L2 at a side of the silicon carbide semiconductor layer. Assume that the outer peripheral end of the seal ring and the outer peripheral end of the passivation film have distance L1 at a corner of the silicon carbide semiconductor layer. Assume that the outer peripheral end of the passivation film has radius of curvature R1 at the corner of the silicon carbide semiconductor layer. In this case, L1>L2 and R1≥L2 are satisfied.

L2 is preferably exemplified to have a value from 5 μm to 25 μm inclusive.

At the corner of the silicon carbide semiconductor layer viewed in the direction perpendicular to the principal surface of the semiconductor substrate, the outer peripheral end of the passivation film preferably has a center of curvature positioned in a region surrounded with the outer peripheral end of the seal ring.

At the corner of the silicon carbide semiconductor layer viewed in the direction perpendicular to the principal surface of the semiconductor substrate, the seal ring has an outer peripheral end having radius of curvature R5, and R1<R5 is preferably satisfied.

The seal ring preferably contains a metal.

A front surface electrode containing the same metal contained in the seal ring is preferably provided on the first electrode of the semiconductor device.

The first electrode and the silicon carbide semiconductor layer preferably form a Schottky contact.

The following description refers to a specific exemplary embodiment of the present disclosure. The description may not include details beyond necessity. For example, already well-known matters may not be described in detail, and substantially identical configurations may not be described repeatedly. These prevent unnecessary redundancy of the following description and lead to easier comprehension by the person skilled in the art. The inventors provide the accompanying drawings and the following description for full comprehension of the present disclosure by the person skilled in the art, without any intention to limit the subject matter recited in the claims Constituent devices functioning identically or similarly will be denoted by identical reference marks in the following description.

Exemplary Embodiment

A semiconductor device according to the exemplary embodiment of the present disclosure will be described hereinafter with reference to the drawings. The present exemplary embodiment assumes that a first conductivity type corresponds to an n-type and a second conductivity type corresponds to a p-type, without limiting to this case. The first conductivity type and the second conductivity type according to the exemplary embodiment of the present disclosure may alternatively correspond to the p-type and the n-type, respectively.

(Structure of Semiconductor Device)

Semiconductor device 1000 according to the present exemplary embodiment will be described with reference to FIG. 1 to FIG. 17.

Figure 2:
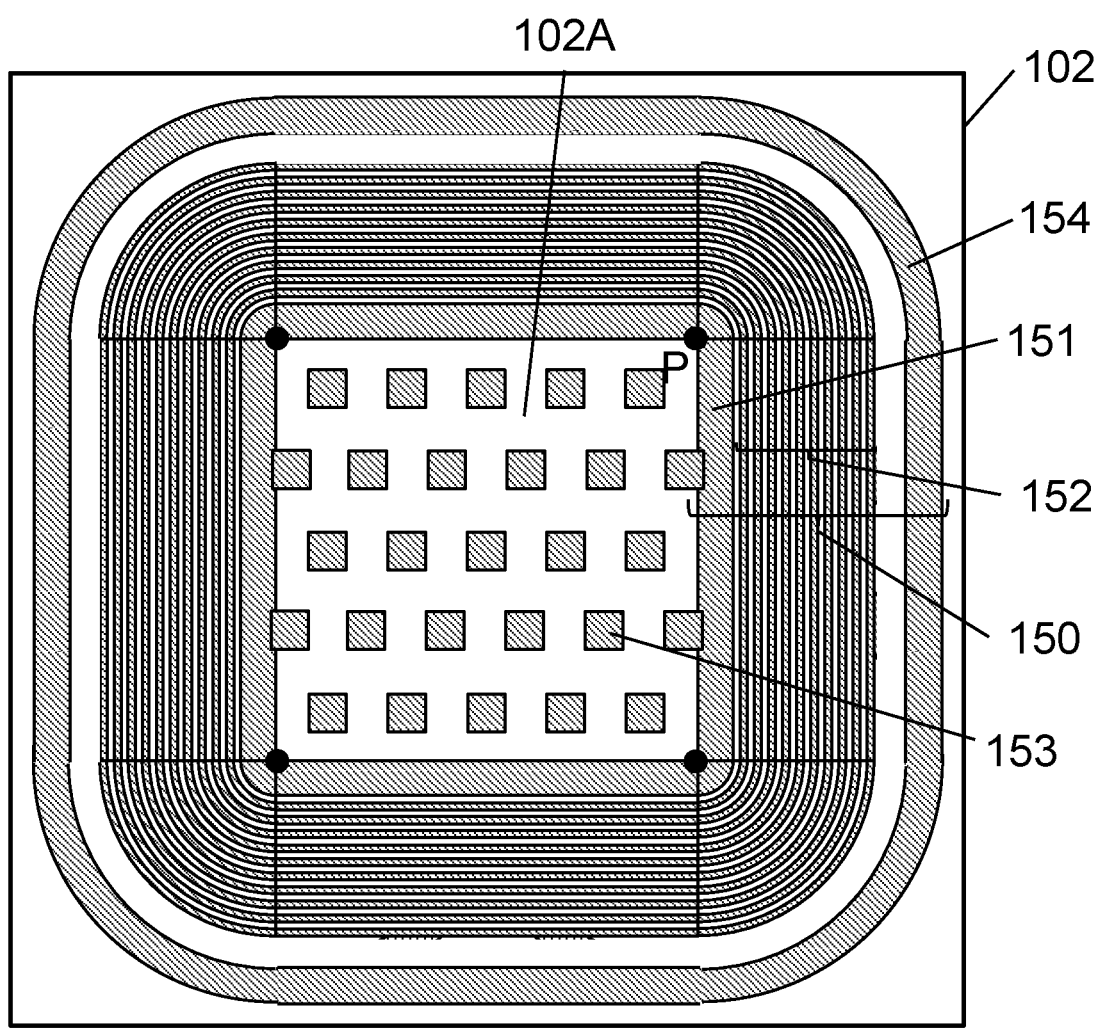
FIG. 2 is a view of an implanted region in a surface of a drift layer included in semiconductor device 1000 according to the exemplary embodiment of the present disclosure.

FIG. 1 and FIG. 2 are a sectional view and a plan view, respectively, for schematic explanation of semiconductor device 1000 according to the present exemplary embodiment. Semiconductor device 1000 includes semiconductor substrate 101 of the first conductivity type, and drift layer 102 disposed on a principal surface of semiconductor substrate 101 as a silicon carbide semiconductor layer of the first conductivity type. Semiconductor device 1000 exemplarily depicted in FIG. 1 includes buffer layer 102B disposed between drift layer 102 and semiconductor substrate 101. Semiconductor device 1000 may not necessarily include buffer layer 102B. Drift layer 102 includes termination region 150. Termination region 150 includes guard ring region 151, field limiting ring (FLR) region 152 provided with a plurality of rings surrounding guard ring region 151, and terminal implanted region 154.

There is provided first electrode 159 on drift layer 102. First electrode 159 and drift layer 102 form a Schottky contact. Semiconductor device 1000 thus configured achieves excellent rectification. First electrode 159 is in contact with guard ring region 151 at an edge of a surface in contact with drift layer 102 provided as the silicon carbide semiconductor layer. First electrode 159 may be an only metallic material in contact with guard ring region 151. Guard ring region 151 and first electrode 159 may form a non-ohmic contact. First electrode 159 has a surface provided with front surface electrode 112.

There is provided insulating film 111 on part of surface 102S of drift layer 102. Insulating film 111 covers part of termination region 150. Part of first electrode 159 may cover insulating film 111. There is provided passivation film 114 covering at least part of insulating film 111. Passivation film 114 may cover part of front surface electrode 112.

When viewed along a normal line of semiconductor substrate 101, there may be provided a plurality of barrier regions 153 of the second conductivity type, in a region inside termination region 150 in drift layer 102. Barrier regions 153 thus provided reduce Schottky leakage current when reverse bias is applied to the Schottky contact formed between first electrode 159 and drift layer 102. Barrier regions 153 are disposed adjacent to surface 102S of drift layer 102. Barrier regions 153 may be in contact with first electrode 159 on surface 102S of drift layer 102.

Surface 102S of drift layer 102 has an end provided with seal ring 1120. There may be provided barrier metal 1590 below seal ring 1120. On surface 102S of drift layer 102, seal ring 1120 or barrier metal 1590 is in contact with terminal implanted region 154 of the second conductivity type via an opening provided in insulating film 111. In a direction from a center to an end of semiconductor substrate 101, contact between seal ring 1120 or barrier metal 1590 and surface 102S of drift layer 102 have width smaller than width of terminal implanted region 154. Seal ring 1120 or barrier metal 1590 and surface 102S of drift layer 102 have a contact plane entirely positioned above terminal implanted region 154. Passivation film 114 covers at least part of seal ring 1120. Passivation film 114 covers an outer end of seal ring 1120 and extends to reach outer portion 111B of insulating film 111 disposed outside seal ring 1120. Insulating film 111 has inner portion 111A and outer portion 111B divided by the opening.

Semiconductor substrate 101 has a rear surface opposing the principal surface and provided with second electrode 110. Second electrode 110 and semiconductor substrate 101 form an ohmic contact. Second electrode 110 has a lower surface not facing semiconductor substrate 101 and provided with rear surface electrode 113. Though not depicted, the rear surface of semiconductor substrate 101 may have an implanted region of the first conductivity type for decrease in contact resistance of the ohmic contact between the rear surface of semiconductor substrate 101 and second electrode 110.

As depicted in FIG. 1, termination region 150 may include guard ring region 151 of the second conductivity type in contact with part of first electrode 159, FLR region 152 serving as a floating region including the plurality of rings of the second conductivity type and surrounding guard ring region 151, and terminal implanted region 154. FLR region 152 is disposed not to be in contact with guard ring region 151. Termination region 150 has only to include at least one region surrounding part of the surface of drift layer 102, and is not limited to the exemplified configuration. For example, termination region 150 may be provided as a junction termination extension (JTE) region having impurity concentration of the second conductivity type changed in an in-plane direction of semiconductor substrate 101.

FIG. 2 is a plan view of a configuration of surface 102S of drift layer 102 in semiconductor device 1000. FIG. 2 does not depict structures on surface 102S of drift layer 102 for easier description. Drift layer 102 has a center region surrounded with termination region 150 and called effective region 102A. First electrode 159 is disposed on at least part of effective region 102A. Effective region 102A has a flow of current on surface 102S of drift layer 102. In the configuration provided with barrier regions 153 as depicted in FIG. 2, semiconductor device 1000 has forward current selectively flowing in effective region 102A while avoiding barrier regions 153. In a case where relatively larger forward voltage is applied to the first electrode in comparison to the second electrode, the forward current may flow also in barrier regions 153.

When negative voltage is applied to first electrode 159 in comparison to second electrode 110 in semiconductor device 1000, high electric field concentration may occur in semiconductor device 1000 to cause withstand voltage decrease. Termination region 150 is provided for inhibition of such withstand voltage decrease. Termination region 150 is disposed to have curvature at a corner of semiconductor device 1000, as depicted in FIG. 2. Termination region 150 can be exemplarily formed by at least two linear regions each having inner and outer peripheries constituted by linear lines, and a fan-shaped region including a curved line. The fan-shaped region is disposed to connect ends of the at least two linear regions. The linear regions exemplified herein each have the inner and outer peripheries constituted only by the linear lines. The inner and outer peripheries may alternatively include a non-linear portion. The two regions connected to the fan-shaped region may not be the linear regions. For example, the two regions may each have the inner and outer peripheries constituted by curved lines having curvature larger than curvature of the fan-shaped region.

As exemplarily depicted in FIG. 2, in termination region 150 disposed at the corner of semiconductor device 1000, inner and outer peripheries of terminal implanted region 154, inner and outer peripheries of the rings in FLR region 152, and an outer periphery of guard ring region 151 have identical center of curvature P. For appropriate depiction of the linear regions and the fan-shaped region in termination region 150, FIG. 2 and drawings relevant to FIG. 2 exemplarily indicate additional lines extending vertically and horizontally from center of curvature P.

Figure 3:
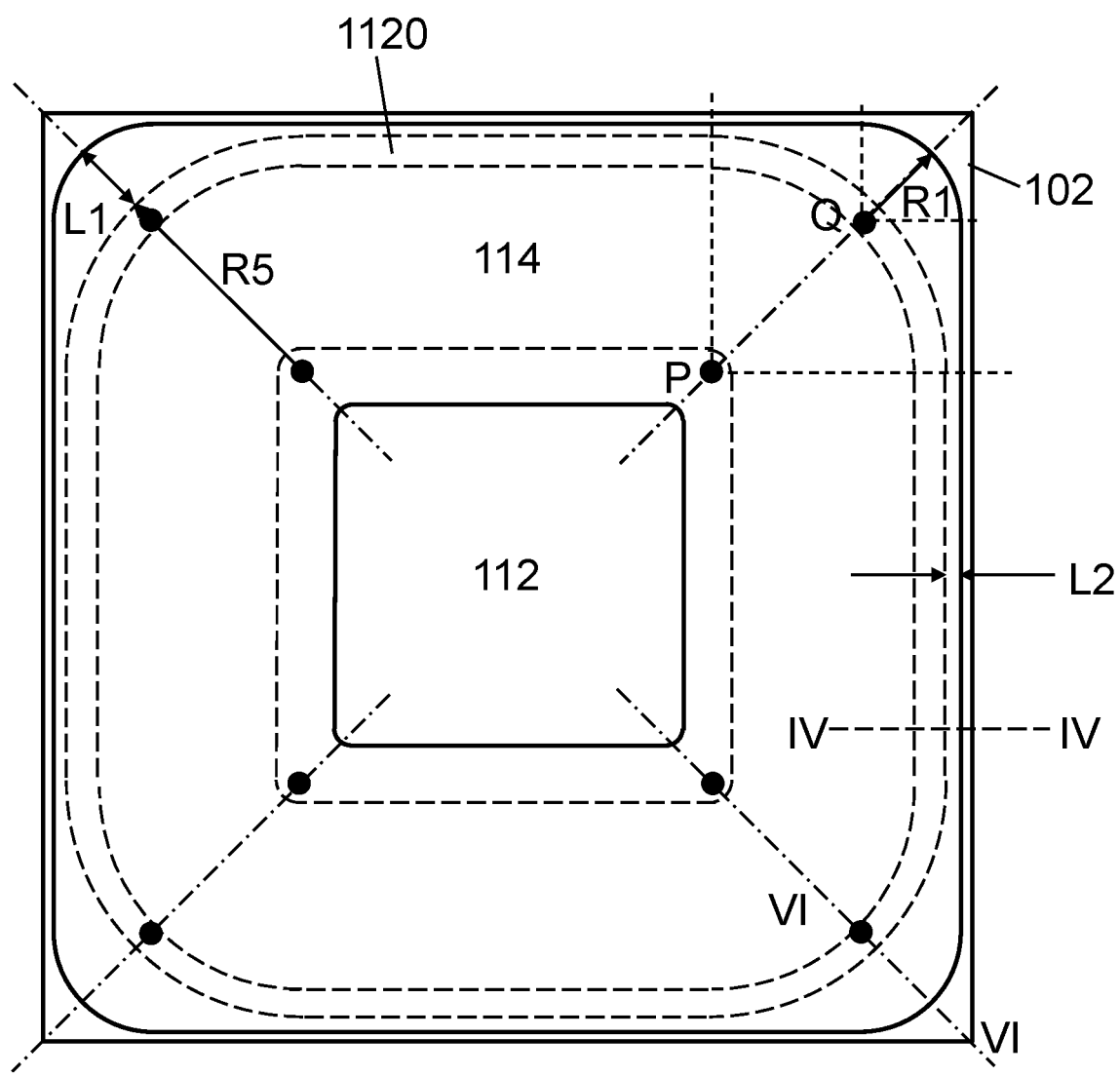
FIG. 3 is a top view of semiconductor device 1000 according to the exemplary embodiment of the present disclosure.

FIG. 3 is a view from front surface electrode 112, of semiconductor device 1000 depicted in FIG. 1. FIG. 3 exemplarily includes dotted lines indicating an end of front surface electrode 112 as well as inner and outer peripheral ends of seal ring 1120, and solid lines indicating inner and outer peripheral ends of passivation film 114. The outer peripheral end of passivation film 114 surrounds the outer peripheral end of seal ring 1120. FIG. 3 exemplarily depicts the end of drift layer 102 indicated by a solid line having a quadrilateral shape and positioned at an outermost periphery. Drift layer 102 is cut out of a semiconductor wafer having sides of four inches or the like, to have a quadrilateral shape. At the corner of semiconductor device 1000, the outer peripheral end of front surface electrode 112 and the inner and outer peripheral ends of seal ring 1120 have a center of curvature positioned at point P indicated in FIG. 2. The outer peripheral end of passivation film 114 has point Q as a center of curvature, positioned outside point P at the corner of semiconductor device 1000. Assume that the outer peripheral end of passivation film 114 have each corner having radius of curvature R1 around point Q. The outer peripheral end of passivation film 114 has sides disposed substantially in parallel with sides of semiconductor device 1000.

The inner and outer peripheral ends of seal ring 1120 have a corner having a center of curvature positioned at point P. The inner and outer peripheral ends of seal ring 1120 have sides disposed substantially in parallel with the sides of semiconductor device 1000. The sides of the inner and outer peripheral ends of seal ring 1120 are accordingly disposed substantially in parallel with the sides of the outer peripheral end of passivation film 114.

Assuming that the outer peripheral end of passivation film 114 and the outer peripheral end of seal ring 1120 have distance L1 at the corner of semiconductor device 1000 and the outer peripheral end of passivation film 114 and the outer peripheral end of seal ring 1120 have distance L2 at a side of semiconductor device 1000, point Q is positioned to satisfy L1>L2, and R1≥L2. When L1>L2 is satisfied, passivation film 114 and insulating film 111 have a larger contact area outside seal ring 1120 at the corner of the semiconductor device. When R1=L2 is satisfied, point Q is positioned at any one of four points of intersection between vertical lines extending from the left and right sides of the outer peripheral end of seal ring 1120 and horizontal lines extending from the upper and lower sides of the outer peripheral end of seal ring 1120. This condition excludes a shape having a right angle at the corner of the outer peripheral end of passivation film 114. When the corner of the outer peripheral end of passivation film 114 has a right angle, stress concentrates at the corner and passivation film 114 is likely to have loose adhesion. When the corner of the outer peripheral end of passivation film 114 has a round shape, stress is less likely to concentrate at a specific portion and passivation film 114 is unlikely to have loose adhesion.

When the outer peripheral end of passivation film 114 is determined in corner shape to satisfy L1>L2 and R1≥L2, the outer peripheral end of passivation film 114 is inhibited from having loose adhesion for enhanced reliability of semiconductor device 1000. Even when the end of passivation film 114 has loose adhesion, such loose adhesion is unlikely to expand to reach seal ring 1120. This keeps high reliability of semiconductor device 1000. How far loose adhesion at the end of passivation film 114 expands can be easily found by visually checking the corner of passivation film 114 outside seal ring 1120. This enables elimination beforehand of any semiconductor device that may have defective reliability.

Point Q may be positioned in a region surrounded with the outer peripheral end of seal ring 1120. L1 is shorter in this case in comparison to a case where point Q is positioned outside the region. Loose adhesion at the end of passivation film 114 is still unlikely to expand to reach seal ring 1120. This leads to enhanced reliability of semiconductor device 1000. Assuming that the outer peripheral end of seal ring 1120 has radius of curvature R5, R1<R5 is preferably satisfied. Passivation film 114 and insulating film 111 accordingly have a larger contact area outside seal ring 1120 at the corner of the semiconductor device. L2 is preferably exemplified to have a value from 5 μm to 25 μm inclusive. This achieves decrease in inactive region of the semiconductor device.

Passivation film 114 is often provided using an organic protective film. Passivation film 114 may thus include the organic protective film. Passivation film 114 is made of polyimide, polybenzoxazole, or the like. The present exemplary embodiment provides passivation film 114 made of polybenzoxazole. Passivation film 114 is formed through application, opening formation, and heat treatment in production steps of semiconductor device 1000. Passivation film 114 is formed to have 10 μm or the like in thickness in an application step. Passivation film 114 is then completed through removal of unnecessary portions, opening formation, and heat treatment. Passivation film 114 formed as an organic protective film contracts through heat treatment. Passivation film 114 thus has different appearance in comparison to a state before opening formation. In a direction perpendicular to the principal surface of semiconductor substrate 101 in semiconductor device 1000, passivation film 114 applied to be 10 μm thick may be decreased in thickness to have about 5 μm after heat treatment. The organic protective film obviously has thermal contraction in the direction perpendicular to the principal surface of semiconductor substrate 101 as well as in a direction parallel to the principal surface of semiconductor substrate 101.

Figure 4A:
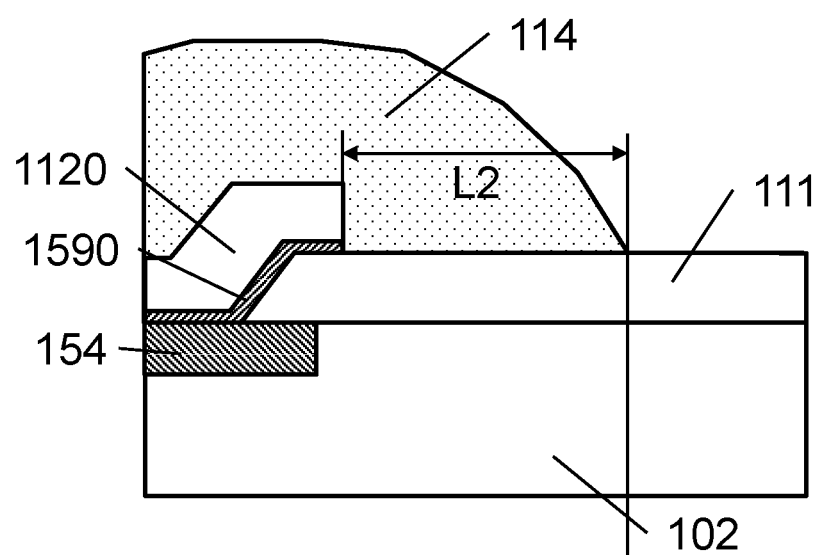
FIG. 4A is a sectional view of an end at a side of semiconductor device 1000 according to the exemplary embodiment of the present disclosure, exemplifying proper adhesion at an outer peripheral end of passivation film 114.
Figure 4B:
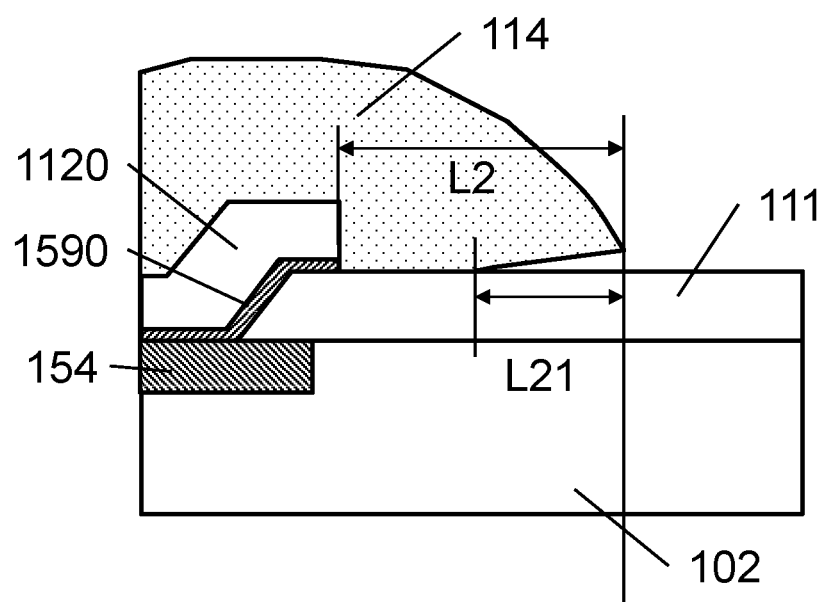
FIG. 4B is a sectional view of the end at the side of semiconductor device 1000 according to the exemplary embodiment of the present disclosure, exemplifying loose adhesion at the outer peripheral end of passivation film 114.
Figure 4C:
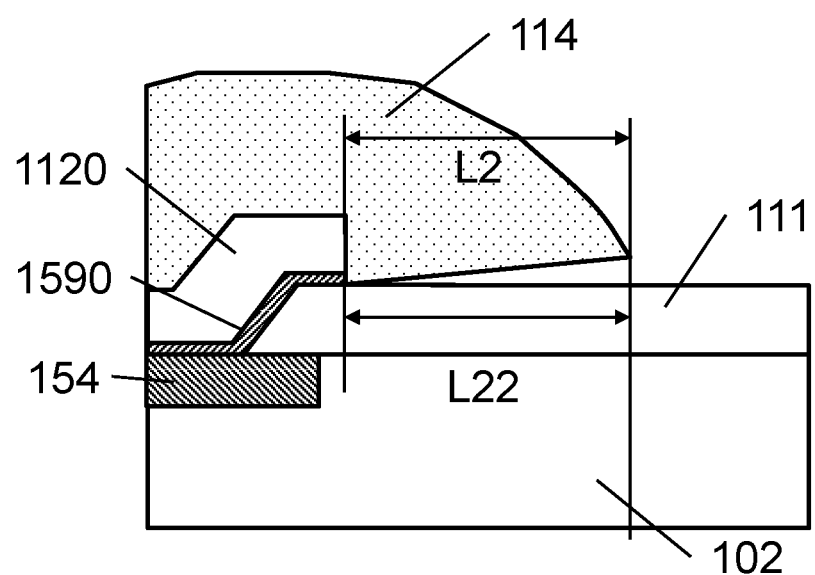
FIG. 4C is another sectional view of the end at the side of semiconductor device 1000 according to the exemplary embodiment of the present disclosure, exemplifying loose adhesion at the outer peripheral end of passivation film 114.

FIG. 4A to FIG. 4C are sectional views taken along line IV-IV indicated in FIG. 3, of an end of semiconductor device 1000. FIG. 4A exemplifies a case where the outer peripheral end of passivation film 114 has properly adheres, whereas FIG. 4B and FIG. 4C each exemplify a case where the outer peripheral end of passivation film 114 has loose adhesion. These figures do not depict drift layer 102 and structures below drift layer 102 for simplification. As depicted in FIG. 4A, the outer peripheral end of passivation film 114 has a smooth shape due to thermal contraction. An outermost position of seal ring 1120 or barrier metal 1590 has distance L2 to the outer peripheral end of passivation film 114. Passivation film 114 is in contact with insulating film 111. As depicted in FIG. 4B, the outer peripheral end of passivation film 114 may partially have loose adhesion only in region L21 or the like. Distance L2 may be sufficiently increased to achieve higher adhesion between passivation film 114 and insulating film 111. However, a region outside seal ring 1120 corresponds to the inactive region of semiconductor device 1000. The region outside seal ring 1120 is thus useless and irrelevant to a flow of current and keeping withstand voltage. Sufficient increase in distance L2 causes increase in chip area and thus decrease in current density per chip. This leads to deterioration in device characteristics. Further increase in chip area for acquisition of equivalent current will lead to increase in cost for semiconductor device 1000. Distance L2 is thus desired to be as small as possible.

Described next is a semiconductor device according to a comparative example, including passivation film 114 having the outer peripheral end including a right-angled corner.

Figure 5:
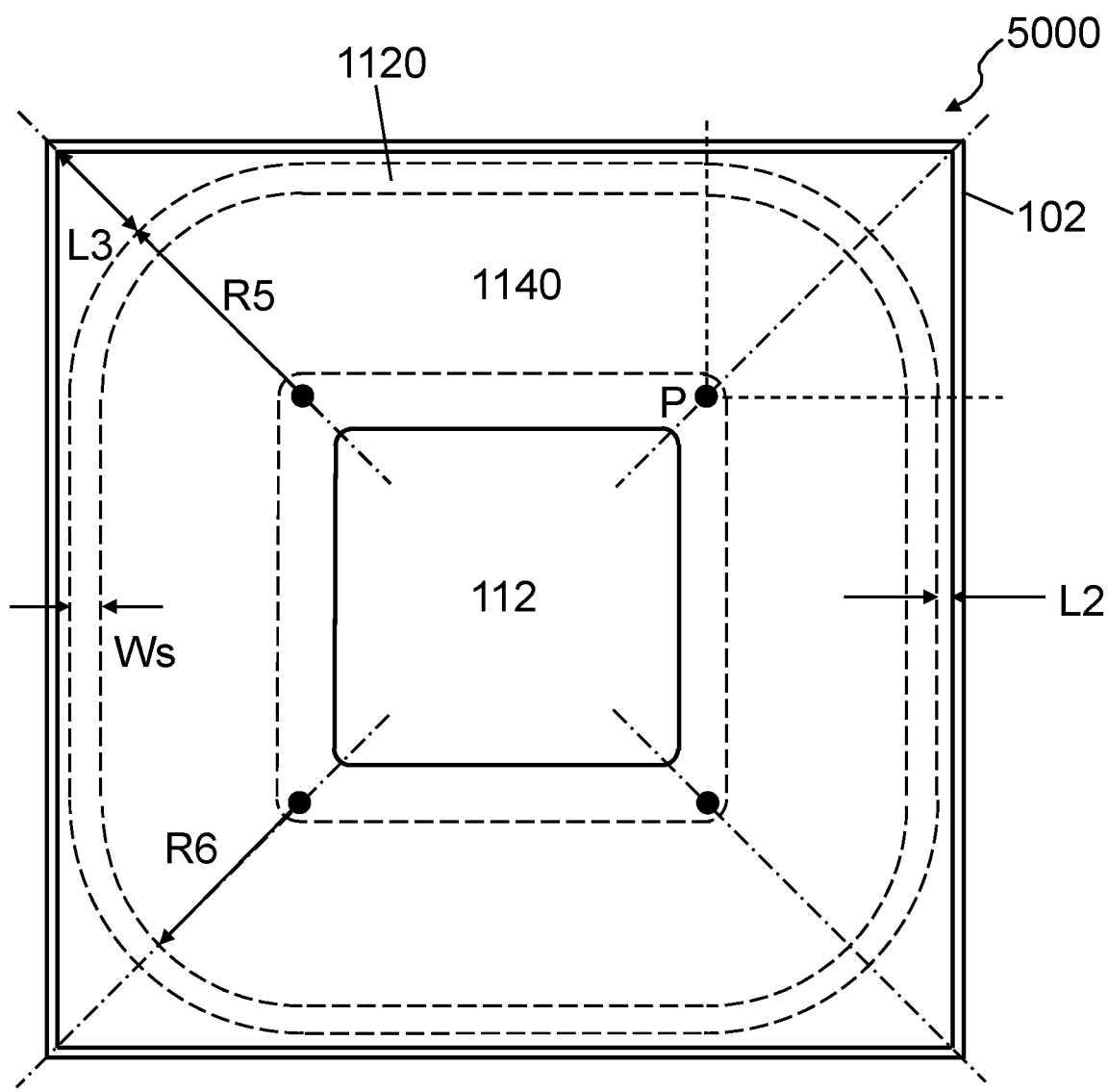
FIG. 5 is a top view of semiconductor device 5000 according to a comparative example.

FIG. 5 is a view from above, of semiconductor device 5000 according to the comparative example. As depicted in FIG. 5, semiconductor device 5000 includes passivation film 1140 having an outer peripheral end disposed substantially in parallel with an end of a chip. In order to increase as much as possible a contact area between passivation film 1140 and insulating film 111 outside seal ring 1120, passivation film 1140 has a corner formed not to have a round shape but to have a substantially right angle. Passivation film 1140 thus shaped is inhibited from having loose adhesion, which has been described.

Assuming that the outer peripheral end of passivation film 1140 and seal ring 1120 has shortest distance L3 at the corner as exemplarily indicated in FIG. 5, distance L3 and distance L1 indicated in FIG. 3 satisfy L3>L1. A region indicated by distance L3 also corresponds to an inactive region of semiconductor device 5000. The region indicated by distance L3 is thus useless and irrelevant to a flow of current. FIG. 5 is referred to again. Assuming that the outer and inner peripheral ends of seal ring 1120 have radii of curvature R5 and R6, respectively, distance L3 can be decreased by disposing center of curvature P at an outermost position as much as possible and decreasing radii of curvature R5 and R6. This achieves further increase in conductive region or active region of semiconductor device 5000.

Such decrease in distance L3 leads to decrease in contact area between passivation film 1140 and insulating film 111 at a corner of semiconductor device 5000. This is likely to cause loose adhesion of the passivation film. The corner of semiconductor device 5000 has large stress during thermal contraction of the passivation film. When the corner of passivation film 1140 has a substantially right angle as depicted in FIG. 5, passivation film 1140 is more likely to have loose adhesion to be peeled off. Since L3 is more than L2 in this structure, passivation film 1140 is more likely to be peeled off at the corner in comparison to loose adhesion at a side. Passivation film 1140 may be gradually peeled off at the corner through assembly steps including processing, packaging, and making a module the semiconductor after formation of passivation film 1140 and may fail to cover a region inside seal ring 1120. This may lead to deterioration in device characteristics or reliability.

In semiconductor device 1000 according to the present disclosure, the outer peripheral end of passivation film 114 has the rounded corner having radius of curvature R1 more than or equal to distance L2, and distance L1 is set to be more than distance L2. When center of curvature P is disposed at an outermost position as much as possible to decrease radii of curvature R5 and R6 as in the comparative example, the corner at the outer peripheral end of passivation film 114 may have loose adhesion when semiconductor device 1000 is viewed from above. Even in this case, the outer peripheral end of passivation film 114 can have equivalent loose adhesion at the corner and the side of semiconductor device 1000 by setting radius of curvature R1 to be more than or equal to distance L2. Distance L1 set to be more than distance L2 leads to increase in contact area between passivation film 114 and insulating film 111. This prevents peeling at the corner that is more influenced by thermal contraction than the side.

Setting distance L1 to be more than distance L2 also achieves effects in addition to the above. Typically in a case where a thin film deposited on a substrate has loose adhesion, a portion having the loose adhesion allows entry of a medium such as air to cause change in refractive index. The loose adhesion of the thin film is thus observed as change in color when viewed from above. The loose adhesion of the thin film is thus found easily. This applies only to a case where the thin film has a certain equality in thickness. Described below are the cases where passivation film 114 has loose adhesion at the side as in FIG. 4B and FIG. 4C. As depicted in FIG. 4B and FIG. 4C, passivation film 114 has a rounded end section due to thermal contraction. Passivation film 114 is thus gradually decreased in thickness toward the end. In a case where distance L2 is as small as about 20 μm and semiconductor device 1000 is viewed from above by a microscope, it is hard to find a difference between presence and absence of loose adhesion as change in color even in a case where there is loose adhesion depicted in FIG. 4B or FIG. 4C outside seal ring 1120. Even in a case where the loose adhesion further expands to reach a portion in contact with seal ring 1120, it is still hard to find the difference between presence and absence of loose adhesion as change in color with seal ring 1120 having width as small as about 20 μm. It is thus typically hard to find abnormality at the end of the side of passivation film 114.

Figure 6A:
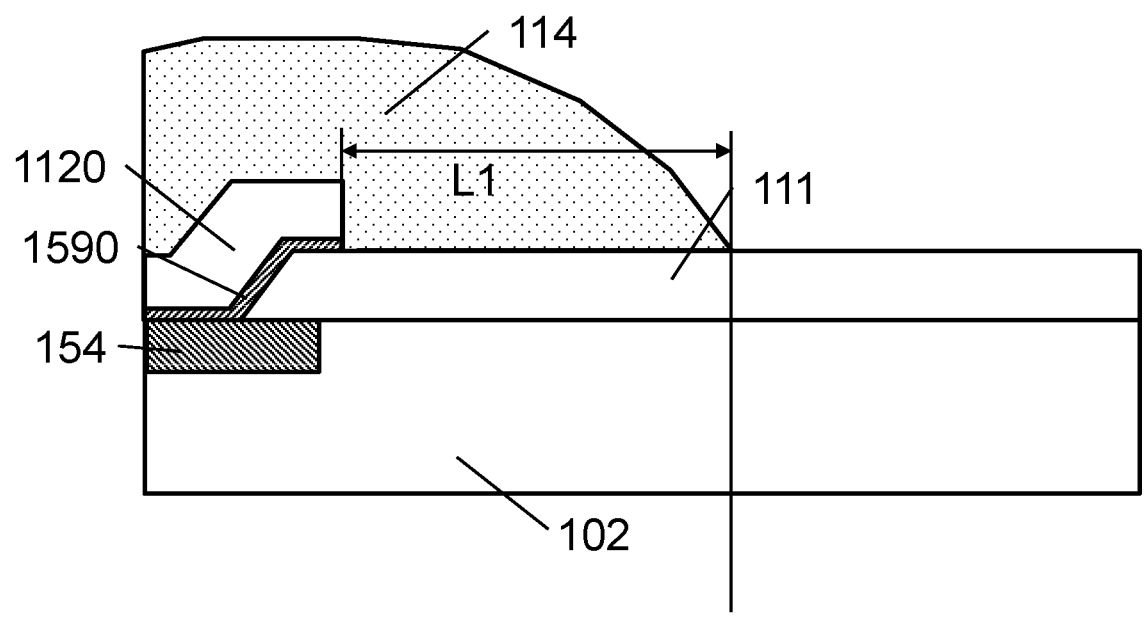
FIG. 6A is a sectional view of an end at a corner of semiconductor device 1000 according to the exemplary embodiment of the present disclosure, exemplifying proper adhesion at the outer peripheral end of passivation film 114.
Figure 6B:
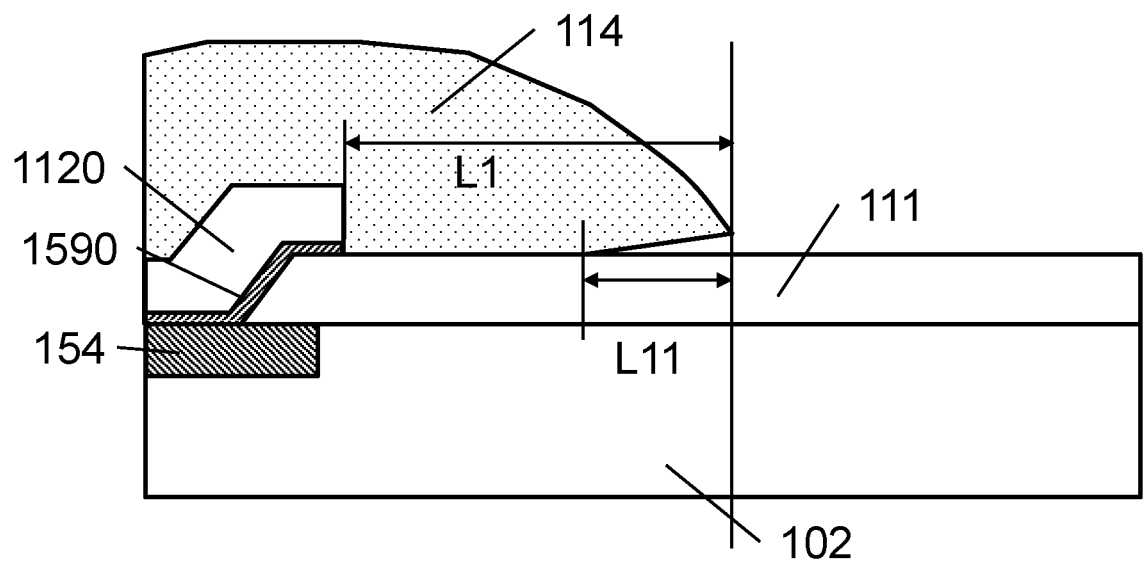
FIG. 6B is a sectional view of the end at the corner of semiconductor device 1000 according to the exemplary embodiment of the present disclosure, exemplifying loose adhesion at the outer peripheral end of passivation film 114.
Figure 6C:
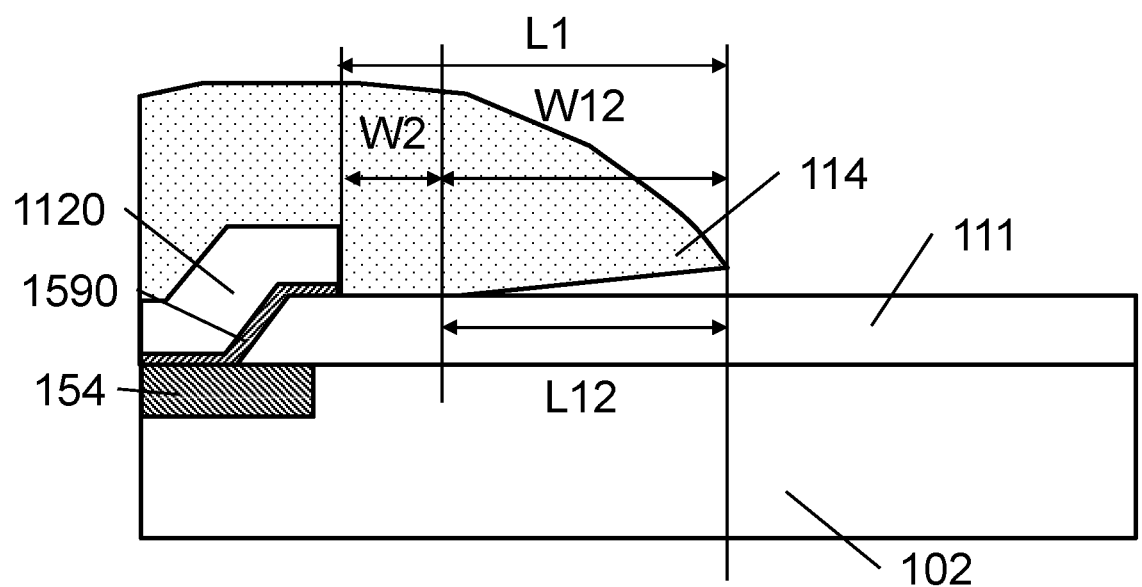
FIG. 6C is another sectional view of the end at the corner of semiconductor device 1000 according to the exemplary embodiment of the present disclosure, exemplifying loose adhesion at the outer peripheral end of passivation film 114.

In semiconductor device 1000 according to the present disclosure, distance L1 at the corner is set to be more than distance L2 at the side. FIG. 6A to FIG. 6C are sectional views at the corner taken along line VI-VI indicated in FIG. 3. FIG. 6A exemplifies a case where the outer peripheral end of passivation film 114 has properly adheres, whereas FIG. 6B and FIG. 6C each exemplify a case where the outer peripheral end of passivation film 114 has loose adhesion. At the corner depicted in FIG. 6C, the outer peripheral end of passivation film 114 has loose adhesion having distance L12 in a direction from an end toward a center of the substrate. This distance is substantially equal to the distance of the loose adhesion of the outer peripheral end of passivation film 114 at the side depicted in FIG. 4C. Assume that a region indicated by distance L1 includes region W12 of loose adhesion and region W2 kept adhering.

Region W2 is found to have no loose adhesion by visually checking change in color among region W12, region W2, and the normal region inside seal ring 1120. Passivation film 114 accordingly secures adhesion to insulating film 111 at the corner partially in the region outside seal ring 1120.

Passivation film 114 also secures adhesion at the corner on seal ring 1120. This enables optical comparison between the corner and the side of passivation film 114 on seal ring 1120. Through visual color comparison in passivation film 114 by microscopy, it is possible to easily find whether or not loose adhesion expands to reach passivation film 114 on seal ring 1120 at the side. Loose adhesion may alternatively be checked not visually but using a measurement device.

In another case where the corner has loose adhesion in the entire region outside seal ring 1120, passivation film 114 outside seal ring 1120 has no region W2 and the region indicated by distance L1 is entirely occupied by region W12. Loose adhesion at the side of passivation film 114 may thus expand to reach the region on seal ring 1120. Passivation film 114 is desired to secure adhesion inside seal ring 1120 for secured reliability of semiconductor device 1000. When passivation film 114 has loose adhesion in the region on seal ring 1120, the loose adhesion may expand to reach the region inside seal ring 1120. It is thus desired to secure adhesion of passivation film 114 in the region on seal ring 1120.

In order to find whether region W2 is secured at the corner, passivation film 114 is disposed to satisfy L1>L2, and R1≥L2. This enables prevention of loose adhesion or peeling of passivation film 114 at the corner, monitoring of a degree of expansion of loose adhesion of passivation film 114, and estimation beforehand of defective reliability of semiconductor device 1000.

The inventors assembled typical packages (TO-247) of semiconductor device 1000 according to the present disclosure and executed stress tests.

Figure 8A:
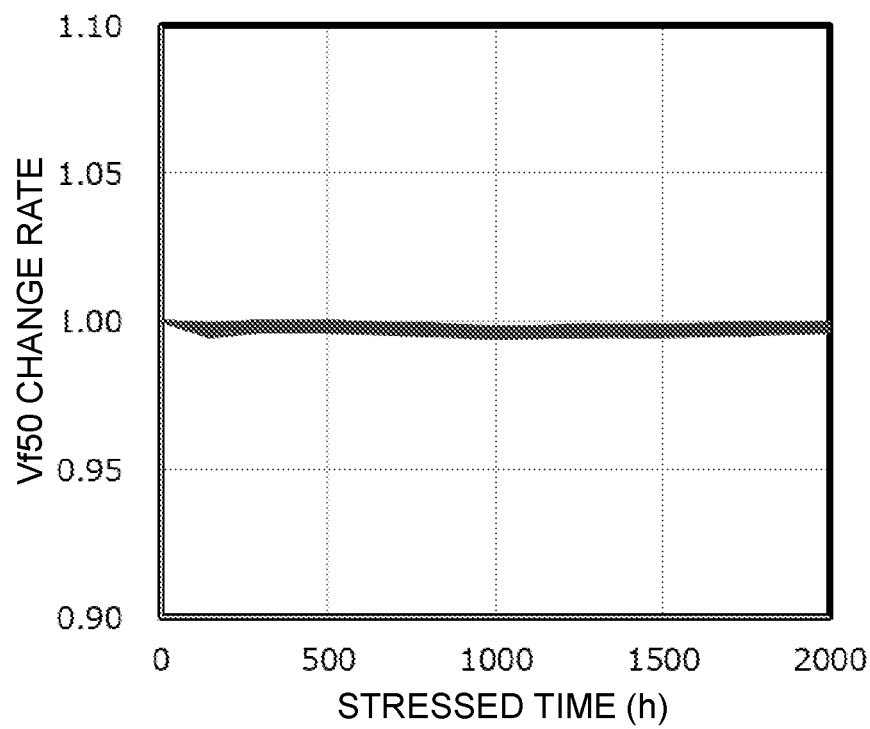
FIG. 8A is a graph of a THB evaluation result of semiconductor device 1000 according to the exemplary embodiment of the present disclosure, indicating a change rate of Vf50.
Figure 8B:
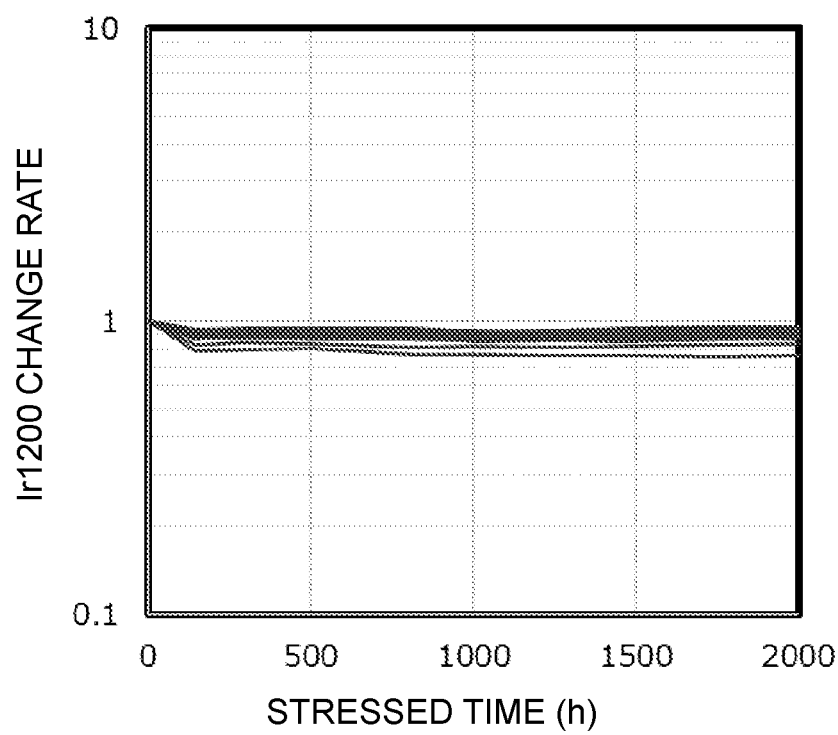
FIG. 8B is a graph of the THB evaluation result of semiconductor device 1000 according to the exemplary embodiment of the present disclosure, indicating a change rate of Ir1200.

FIG. 7A and FIG. 7B are graphs each indicating a result of a high temperature reverse bias (HTRB) test applied to semiconductor device 1000 according to the present disclosure. FIG. 8A and FIG. 8B are graphs each indicating a result of a temperature humidity bias (THB) test applied to semiconductor device 1000 according to the present disclosure. Table 1 indicates specific configurations of semiconductor device 1000.

Other configurations and the like will be described later.

The HTRB test included applying voltage of −1200 V to front surface electrode 112 in comparison to rear surface electrode 113 in an environment of temperature at 175° C. The THB test included applying voltage of −1000 V to front surface electrode 112 in comparison to rear surface electrode 113 in an environment of temperature at 85° C. and relative humidity at 85%. The inventors prepared 22 semiconductor devices 1000 according to the present disclosure for each of the HTRB test and the THB test. The inventors subsequently measured current-voltage characteristics at room temperature, compared the measured current-voltage characteristics with current-voltage characteristics prior to execution of the HTRB test and the THB test, and graphically indicated characteristic change. Semiconductor device 1000 viewed from above is assumed to have an area of 0.2 cm². Semiconductor device 1000 is assumed to have a forward direction as a direction of a current flow from front surface electrode 112 to rear surface electrode 113. Front surface electrode 112 is assumed to have on-state voltage of Vf50 relative to rear surface electrode 113 in a case where the forward current is 50 A. Leakage current flowing in a reverse direction is assumed to have Ir1200 when the voltage applied to front surface electrode 112 is −1200 V in comparison to rear surface electrode 113. FIG. 7A and FIG. 8A has a Vf50 change rate obtained by dividing Vf50 after stress application by (initial) Vf50 before stress application. The Vf50 change rate equal to one indicates that Vf50 has not changed from the initial value, whereas the Vf50 change rate more than one indicates that Vf50 has increased from the initial value. Similarly, an Ir1200 change rate is obtained by dividing Ir1200 after stress application by (initial) Ir1200 before stress application. In each of the tests, on-state voltage Vf50 and leakage current Ir1200 had little change from the values before stress application even after application of stress of at least 2000 hours. Semiconductor device 1000 according to the present disclosure is thus found to have a structure durable against the HTRB test and the THB test.

(Method of Producing Semiconductor Device)

Described next is the method of producing semiconductor device 1000 according to the present exemplary embodiment. FIG. 9 to FIG. 17 are explanatory sectional views each depicting part of the method of producing semiconductor device 1000 according to the present exemplary embodiment.

Semiconductor substrate 101 is prepared initially. Semiconductor substrate 101 is exemplarily of the first conductivity type (n-type) 4H-SiC (0001) having resistivity as low as about 0.02 Ωcm, and is obtained through four times of off-cutting in a <11-20> direction. The mark "-" included in <11-20> indicates a bar. Accordingly, <11-20> indicates $<11\bar{2}0>$.

Figure 9:
FIG. 9 is a sectional view depicting a method of producing semiconductor device 1000 according to the exemplary embodiment of the present disclosure.

As depicted in FIG. 9, n-type drift layer 102 is formed on semiconductor substrate 101 by epitaxial growth. Herein, n-type drift layer 102 is lower in impurity concentration than the semiconductor substrate. Prior to formation of drift layer 102, n-type buffer layer 102B made of SiC having high

TABLE 1

| Constituent device | Material | Conductivity type | Impurity density (1/cm³) | Others |
|---|---|---|---|---|
| Buffer layer 102B | 4H—SiC | n-type | $1 \times 10^{18}$ | Thickness 1 μm |
| Drift layer 102 | 4H—SiC | n-type | $1 \times 10^{16}$ | Thickness 11 μm |
| Guard ring region 151 | 4H—SiC | p-type | Surface concentration $\geq 1 \times 10^{20}$ | Implanted ions: Al |
| FLR region 152 | 4H—SiC | p-type | Surface concentration $\geq 1 \times 10^{20}$ | Implanted ions: Al |
| Barrier regions 153 | 4H—SiC | p-type | Surface concentration $\geq 1 \times 10^{20}$ | Implanted ions: Al |
| Terminal implanted region 154 | 4H—SiC | p-type | Surface concentration $\geq 1 \times 10^{20}$ | Implanted ions: Al |
| Schottky electrode 159 | Ti | — | — | Thickness 0.2 μm |
| Insulating film 111 | SiO₂ | — | — | Thickness 1.4 μm |
| Passivation film 114 | Polybenzoxazole | — | — | Thickness 5 μm | impurity concentration may be deposited on semiconductor substrate 101. The buffer layer exemplarily has impurity concentration of $1\times10^{18}$ cm$^{-3}$ and thickness of 1 μm. Drift layer 102 is made of n-type 4H—SiC or the like, and exemplarily has impurity concentration and thickness of $1\times10^{16}$ cm$^{-3}$ and 11 μm, respectively. The impurity concentration and the thickness are appropriately set to achieve necessary breakdown voltage. The impurity concentration and the thickness are thus not limited to these numerical values.

Figure 10:
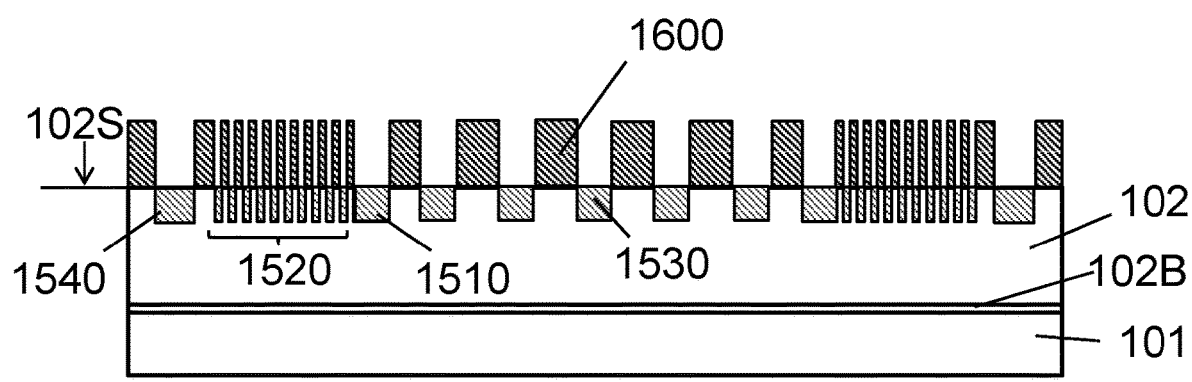
FIG. 10 is an explanatory sectional view on the method of producing semiconductor device 1000 according to the exemplary embodiment of the present disclosure.

As depicted in FIG. 10, mask 1600 made of SiO$_2$ or the like is subsequently formed on drift layer 102 and Al ions or the like are then implanted into drift layer 102. Drift layer 102 is thus provided with ion implanted regions 1510, 1520. Ion implanted regions 1510, 1520 will later turn into guard ring region 151 and FLR region 152, respectively. Ion implanted region 1540 to turn into terminal implanted region 154 and ion implanted region 1530 to turn into barrier regions 153 may be provided simultaneously. In this case, mask 1600 has only to have additional openings corresponding to portions to be provided with ion implanted regions 1530, 1540. Ion implanted regions 1530, 1540 can thus be formed simultaneously with ion implanted regions 1510, 1520. There is no need to add any step for formation of terminal implanted region 154. This leads to simplification of the production steps.

In this case, ion implanted regions 1510, 1520, 1530, 1540 have equal concentration profiles in a direction perpendicular to surface 102S of drift layer 102. Barrier regions 153 and terminal implanted region 154 are not necessarily provided. Barrier regions 153 may be provided appropriately depending on necessity for decrease in leakage current in semiconductor device 1000. Terminal implanted region 154 may be provided appropriately depending on necessity for enhancement in humidity resistance.

Though not depicted, impurities of the first conductivity type like phosphorus or nitrogen may be implanted into the rear surface of semiconductor substrate 101 as necessary for further increase in concentration of the first conductivity type at the rear surface.

Figure 11:
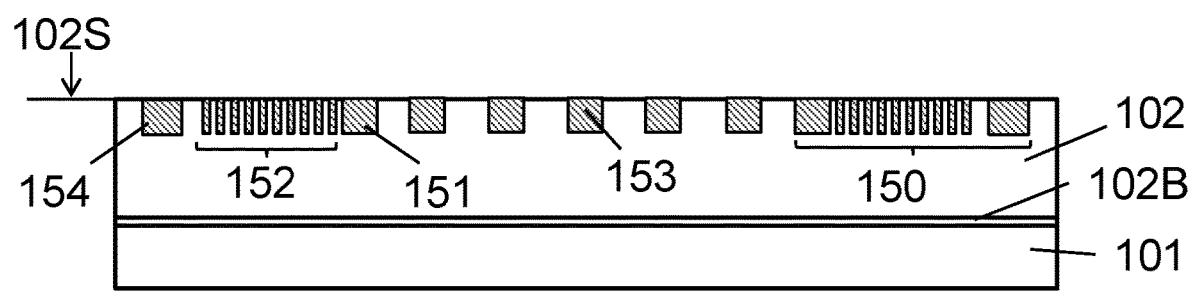
FIG. 11 is an explanatory sectional view on the method of producing semiconductor device 1000 according to the exemplary embodiment of the present disclosure.

As depicted in FIG. 11, mask 1600 is subsequently removed and heat treatment is then executed at temperature approximately from 1500° C. to 1900° C. to obtain guard ring region 151, FLR region 152, barrier regions 153, and terminal implanted region 154 of the second conductivity type or the p-type from ion implanted regions 1510, 1520, 1530, 1540, respectively. The impurity concentration of the second conductivity type may be set to be more than or equal to $1\times10^{20}$ cm$^{-3}$ in this case. Such increase in impurity concentration of the second conductivity type leads to decrease in width between barrier regions 153 and the first electrode provided on the surfaces of barrier regions 153, as well as decrease in width of a depletion layer generated between terminal implanted region 154 and the seal ring or the barrier metal provided on the surface of terminal implanted region 154. This leads to decrease in contact resistance. A carbon film may be deposited on the surface of drift layer 102 before heat treatment, and the carbon film may be removed after the heat treatment. A thermal oxide film may be subsequently formed on the surface of drift layer 102 and then be removed by etching to clean the surface of drift layer 102.

In exemplary depiction in FIG. 1, guard ring region 151 has width of 15 μm or the like in an in-plane direction of surface 102S of drift layer 102. FLR region 152 includes the plurality of rings or FLRs surrounding guard ring region 151. Implanted regions for formation of the plurality of FLRs may each have width from 1 μm to 2 μm and be provided at an interval of approximately from 0.7 μm to 5 μm. The width of the FLRs and the interval between the adjacent FLRs may be fixed or may be changed for achievement of desired withstand voltage of semiconductor device 1000. A number of the FLRs in FLR region 152 is 25 in the present exemplary embodiment. The number may also be changed for achievement of desired withstand voltage, and may be approximately from 10 to 30. Termination region 150 including guard ring region 151 and FLR region 152 contains impurities of the second conductivity type exemplarily having maximum concentration of about $2\times10^{20}$ cm$^{-3}$ and depth of 1 μm.

The depth of the impurities of the second conductivity type is defined as follows. Termination region 150 is formed through ion implantation or the like. When impurity concentration of the second conductivity type is plotted in a depth direction from the surface, the concentration has a value specified in accordance with an ion implantation condition to a certain depth level. The specified value is higher than impurity concentration of the first conductivity type in drift layer 102. Implanted ions will not reach a deep region. The implanted ions accordingly have concentration decreased in the deep region. Assume that concentration of the first conductivity type in drift layer 102 is constant in the depth direction and has $1\times10^{16}$ cm$^{-3}$, for example. In a case where impurity concentration of the second conductivity type is equal (at $1\times10^{16}$ cm$^{-3}$) to impurity concentration of the first conductivity type at a certain depth level and does not exceed the impurity concentration of the first conductivity type (at $1\times10^{16}$ cm$^{-3}$) in a region deeper than the depth level, the depth level is defined as depth of impurities of the second conductivity type.

In exemplary depiction in FIG. 1, barrier regions 153 may have width of 2 μm or the like in the in-plane direction of surface 102S of drift layer 102, and may be disposed at an interval approximately from 2 μm to 6 μm. The barrier regions may be appropriately determined in terms of the shape and the interval for achievement of desired characteristics of the semiconductor device. In exemplary depiction in FIG. 1, terminal implanted region 154 has width of 15 μm or the like in the in-plane direction of surface 102S of drift layer 102, and is disposed distant from FLR region 152.

Figure 12:
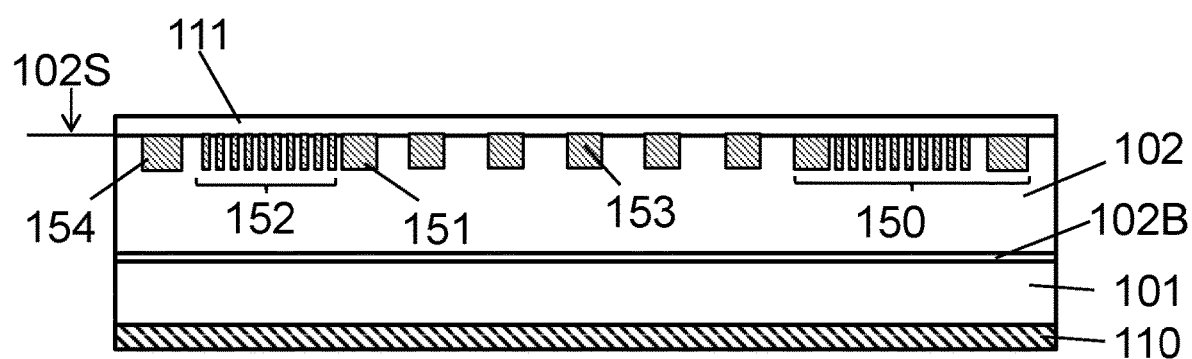
FIG. 12 is an explanatory sectional view on the method of producing semiconductor device 1000 according to the exemplary embodiment of the present disclosure.

As depicted in FIG. 12, insulating film 111 made of SiO$_2$ or the like is subsequently formed to have 1400 nm or the like on surface 102S of drift layer 102, Ni or the like is then deposited to have about 200 nm on the rear surface of semiconductor substrate 101, and heat treatment at about 1000° C. is then executed to obtain second electrode 110. Second electrode 110 and the rear surface of semiconductor substrate 101 form an ohmic contact. The electrode is not limited to Ni in terms of its type, but may be made of a metal that can form a silicide and is selected from Ti, Mo, and the like.

Figure 13:
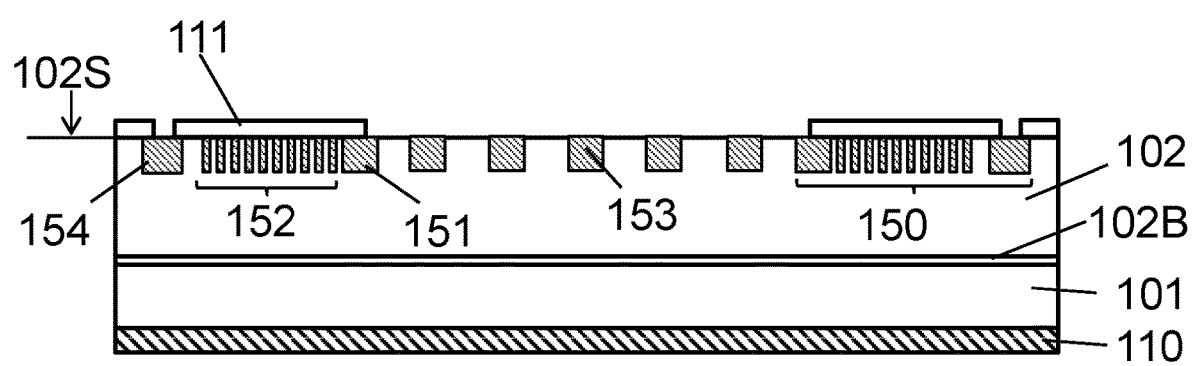
FIG. 13 is an explanatory sectional view on the method of producing semiconductor device 1000 according to the exemplary embodiment of the present disclosure.

A mask is subsequently formed using a photoresist, and part of guard ring region 151, drift layer 102 inside guard ring region 151, and part of terminal implanted region 154 are exposed by wet etching or the like. The mask is then removed. Insulating film 111 having openings is thus obtained as depicted in FIG. 13. A method of forming the openings is not limited to wet etching, but may include dry etching or may include both dry etching and wet etching.

Figure 14:
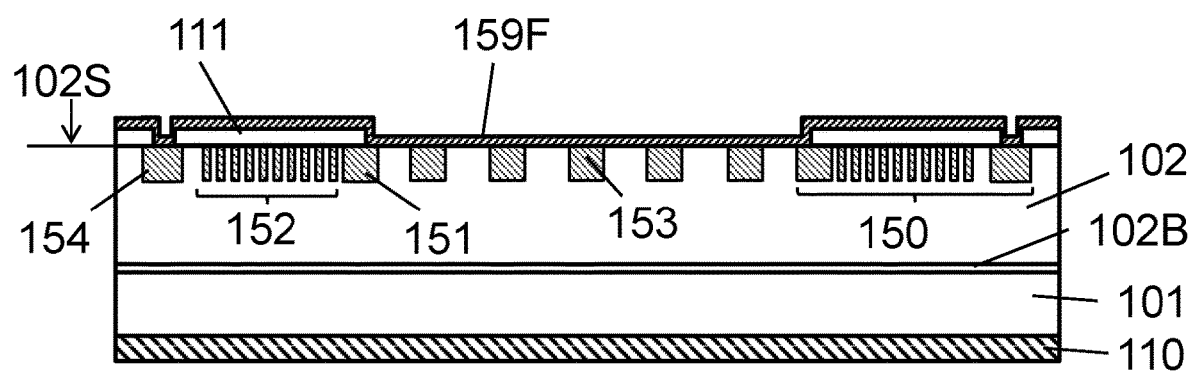
FIG. 14 is an explanatory sectional view on the method of producing semiconductor device 1000 according to the exemplary embodiment of the present disclosure.

As depicted in FIG. 14, first electrode conductive film 159F is subsequently deposited to cover insulating film 111 having the openings and entire drift layer 102 exposed in the openings. First electrode conductive film 159F is made of a metal that can form a Schottky barrier to drift layer 102. First electrode conductive film 159F is made of Ti, Ni, Mo, or the like and has 200 nm or the like in thickness. After first electrode conductive film 159F is deposited, semiconductor substrate 101 provided with first electrode conductive film 159F is heat-treated at temperature from 100° C. to 700° C. inclusive. First electrode conductive film 159F accordingly forms a Schottky contact to drift layer 102 provided with neither barrier regions 153 nor terminal implanted region 154.

Figure 15:
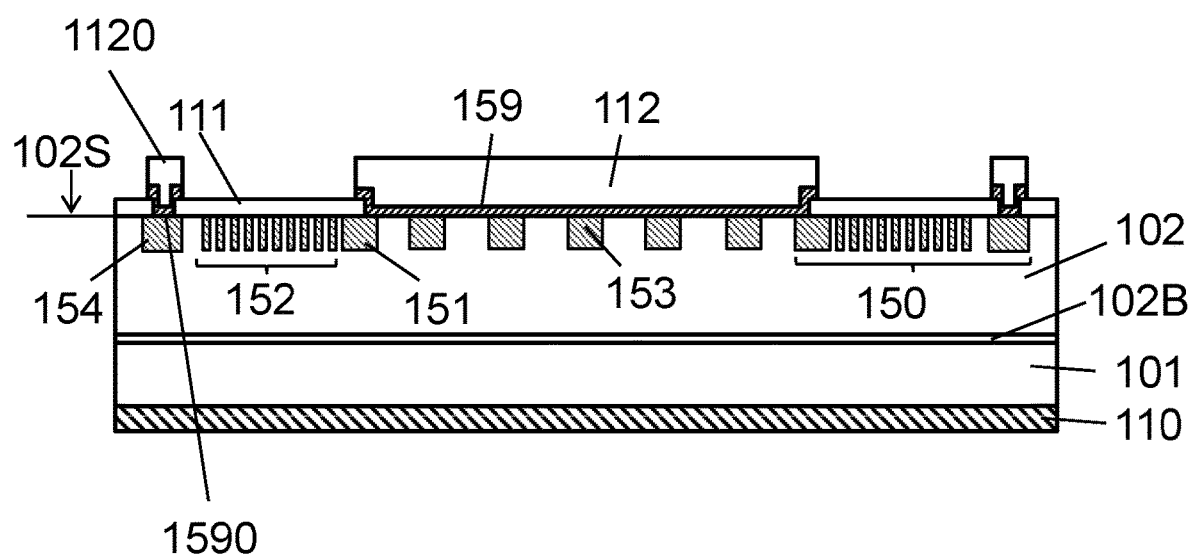
FIG. 15 is an explanatory sectional view on the method of producing semiconductor device 1000 according to the exemplary embodiment of the present disclosure.

A front surface electrode conductive film is subsequently deposited on first electrode conductive film 159F. The front surface electrode conductive film is a metal film containing Al or the like and having approximately from 3 μm to 6 μm in thickness. A mask is formed on the front surface electrode conductive film and unnecessary portions are etched to also remove part of first electrode conductive film 159F and expose part of insulating film 111. The mask is removed after etching the front surface electrode conductive film and the part of first electrode conductive film 159F, to obtain front surface electrode 112 and patterned first electrode 159 as depicted in FIG. 15. There are further formed seal ring 1120 and barrier metal 1590. Etching executed in this case may be wet etching or dry etching. First electrode 159 and barrier metal 1590 thus formed are constituted similarly, or are made of a same material. In a case where first electrode 159 is constituted by a metal thin film mainly made of Ti, barrier metal 1590 is also constituted by a metal thin film mainly made of Ti. Front surface electrode 112 and seal ring 1120 are constituted similarly, or are made of a same material. In a case where front surface electrode 112 is constituted by a metal film mainly made of Al, seal ring 1120 is also constituted by a metal film mainly made of Al. There may be provided a metal like Ti, Ni, or Mo below seal ring 1120. This leads to enhanced humidity resistance of the semiconductor device.

Figure 16:
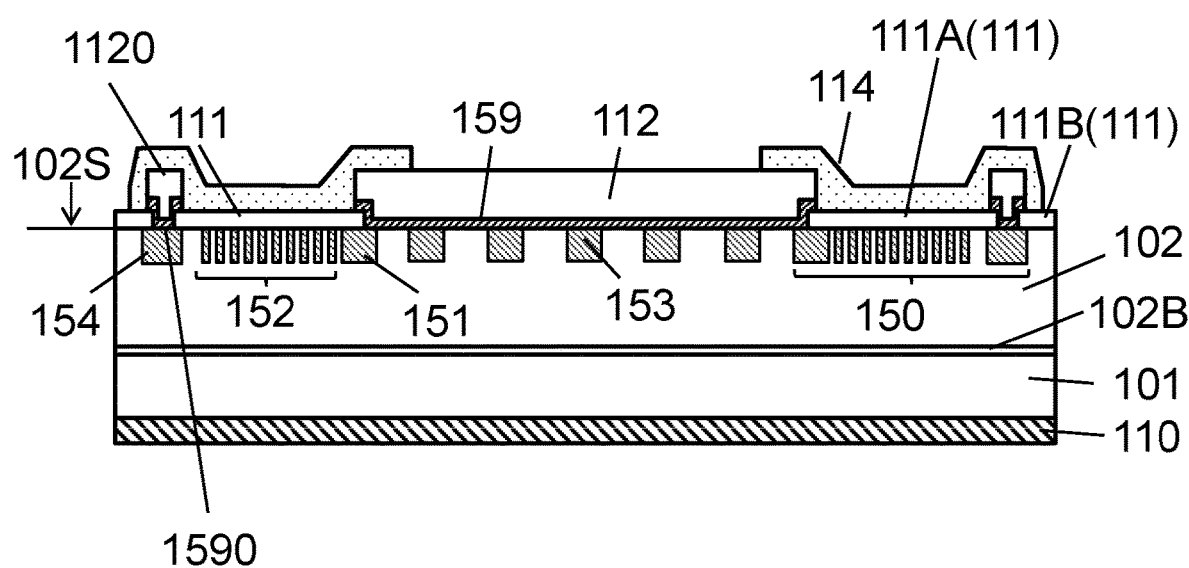
FIG. 16 is an explanatory sectional view on the method of producing semiconductor device 1000 according to the exemplary embodiment of the present disclosure.

Exposed insulating film 111 and front surface electrode 112 are subsequently formed, and an organic passivation film made of polyimide or the like is formed on seal ring 1120. Front surface electrode 112 on first electrode 159 may contain a metal same as the metal contained in seal ring 1120. Front surface electrode 112 and seal ring 1120 can thus be formed in an identical step for simplification of the production steps. After the insulating film for the passivation film is formed, there is prepared a mask having openings to expose, in the insulating film for the passivation film, a portion provided on part of front surface electrode 112 and a portion provided on an end of outer portion 111B of insulating film 111. Through dry etching, wet etching, development or the like using the mask, part of the insulating film for the passivation film is etched to expose part of front surface electrode 112 and the end of outer portion 111B of insulating film 111. The mask is then removed. As depicted in FIG. 16, there is thus obtained passivation film 114 opened to expose part of front surface electrode 112 and the end of outer portion 111B of insulating film 111.

Passivation film 114 is desirably made of an organic insulator. Passivation film 114 is provided as an organic protective film included in a typical semiconductor power device and made of polyimide, polybenzoxazole, or the like.

Figure 17:
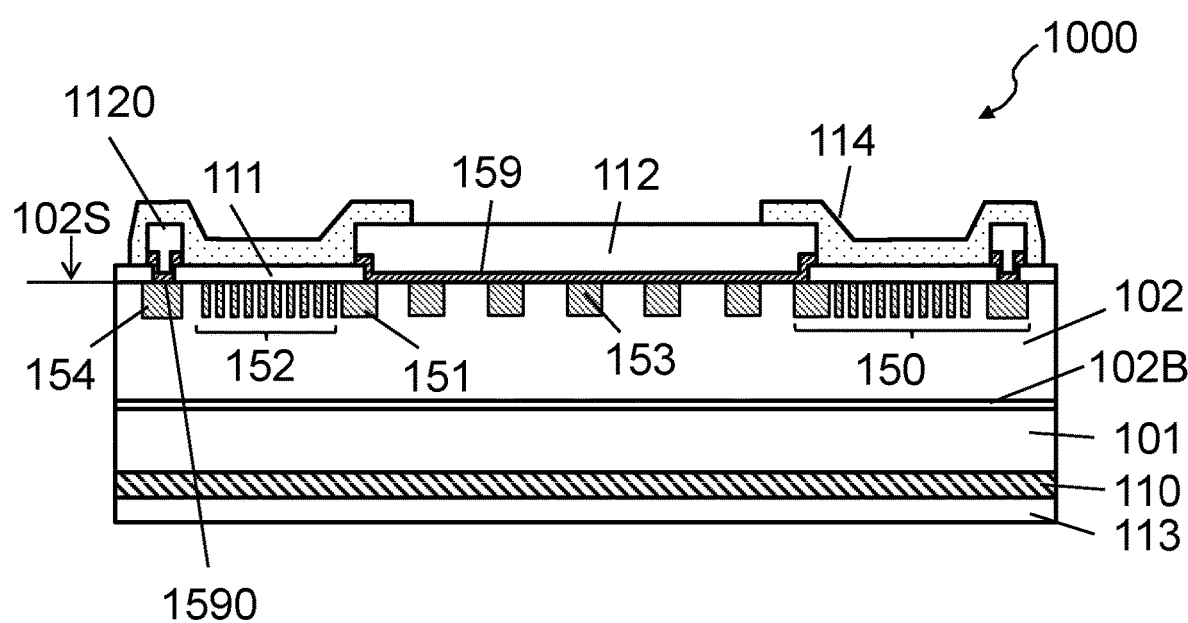
FIG. 17 is an explanatory sectional view on the method of producing semiconductor device 1000 according to the exemplary embodiment of the present disclosure.

As depicted in FIG. 17, rear surface electrode 113 is subsequently formed as necessary. A step of forming rear surface electrode 113 may alternatively be positioned before a step of forming passivation film 114 or before a step of forming front surface electrode 112. Rear surface electrode 113 is exemplarily formed through deposition of Ti, Ni, and Ag in the mentioned order from an end in contact with second electrode 110. Ti, Ni, and Ag exemplarily have 0.1 μm, 0.3 μm, and 0.7 μm in thickness, respectively. Semiconductor device 1000 is obtained through the above steps.

Modification Examples

Described below is a semiconductor device according to each of modification examples of the present exemplary embodiment.

Figure 18:
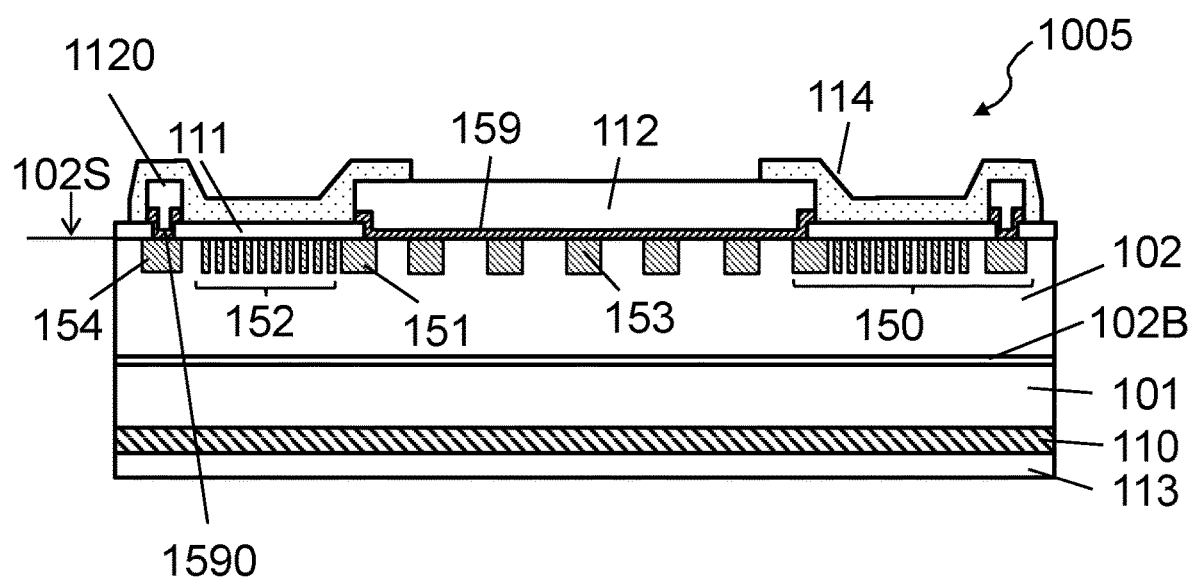
FIG. 18 is a sectional view of a semiconductor device according to a first different example of the present disclosure.
Figure 19:
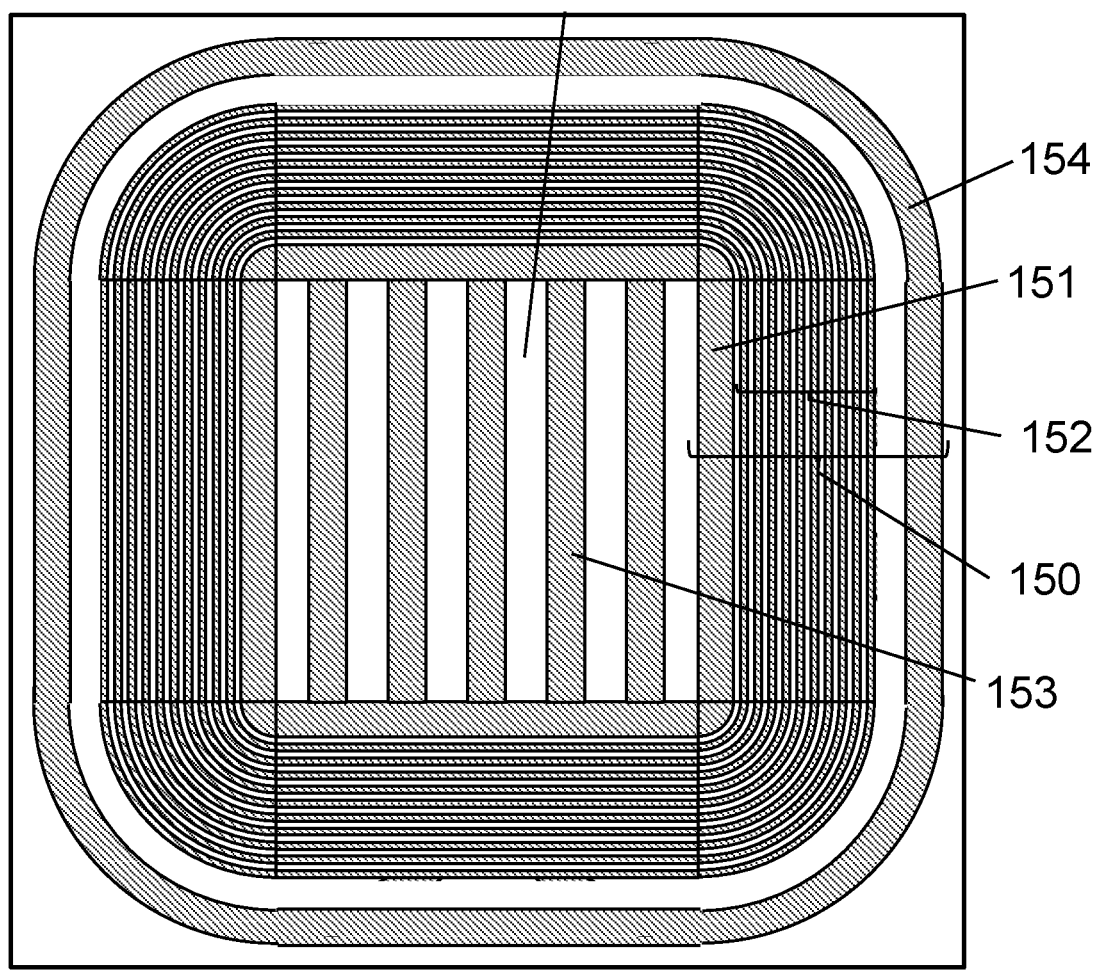
FIG. 19 is a view of an implanted region in a surface of a drift layer in the semiconductor device according to the first different example of the present disclosure.

Semiconductor device 1000 according to the present disclosure has a JBS structure provided with barrier regions 153. Barrier regions 153 may be changed in shape as depicted in FIG. 18 and FIG. 19. FIG. 18 and FIG. 19 depict semiconductor device 1005 including barrier regions 153 not having the quadrilateral shape but having a stripe shape extending in a single direction. Reliability can be secured also in this case by disposition of passivation film 114 as depicted in FIG. 3.

Figure 20:
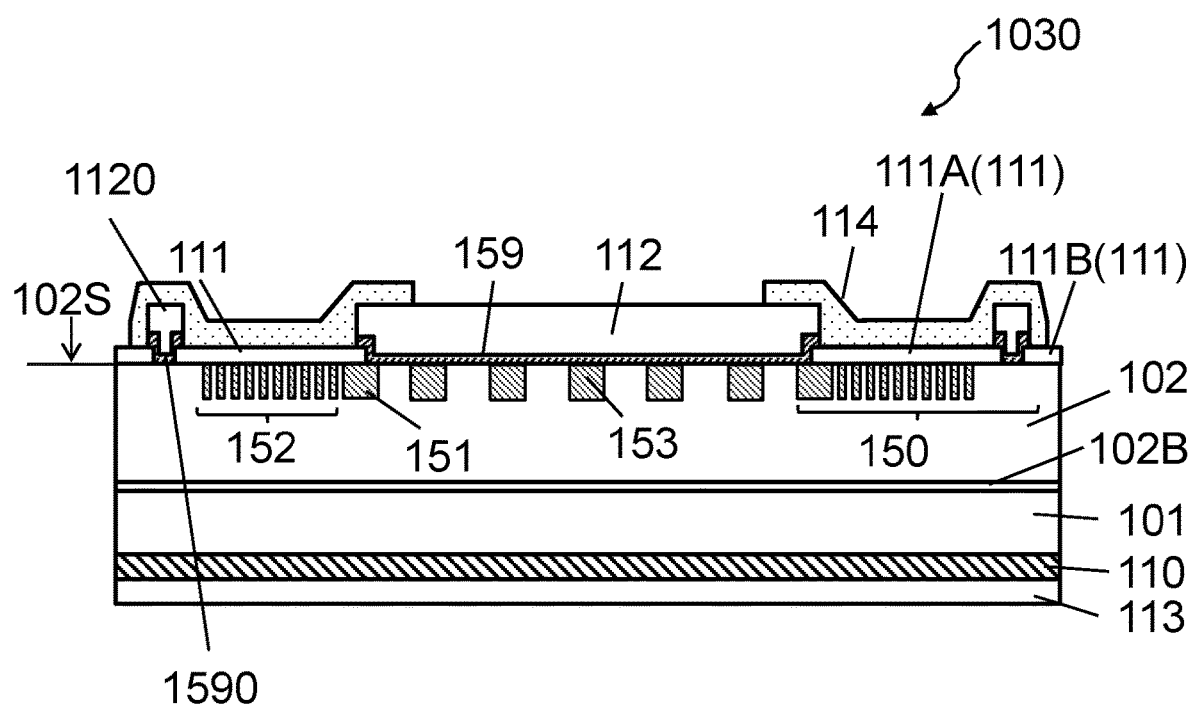
FIG. 20 is a sectional view of a semiconductor device according to a second different example of the present disclosure.
Figure 21:
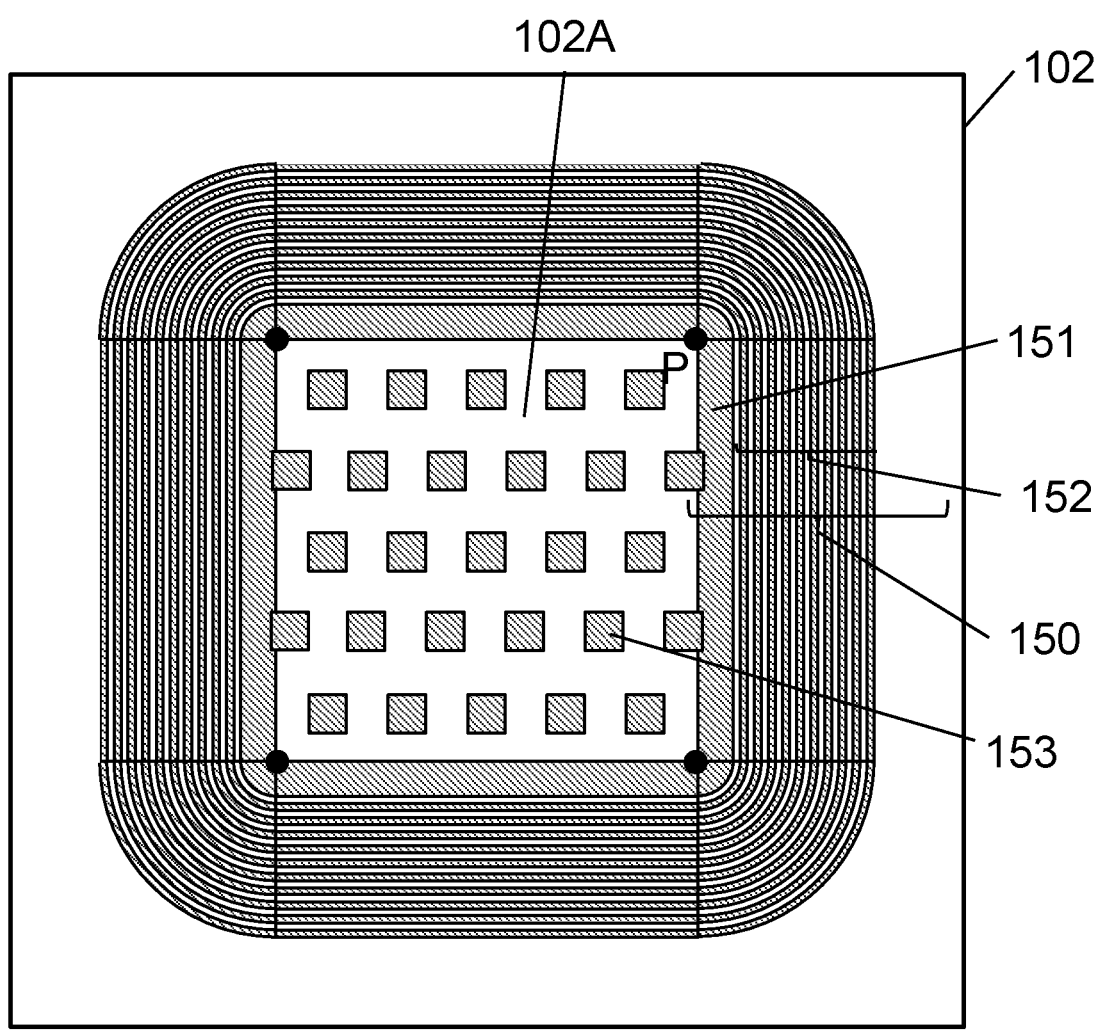
FIG. 21 is a view of an implanted region in a surface of a drift layer in the semiconductor device according to the second different example of the present disclosure.

FIG. 20 and FIG. 21 depict semiconductor device 1030 provided with no terminal implanted region 154. Reliability can be secured also in this case by disposition of passivation film 114 as depicted in FIG. 3. Termination region 150 includes no terminal implanted region 154 in this structure, and barrier metal 1590 disposed below seal ring 1120 is thus in contact with silicon carbide semiconductor layer 102 of the first conductivity type.

Figure 22:
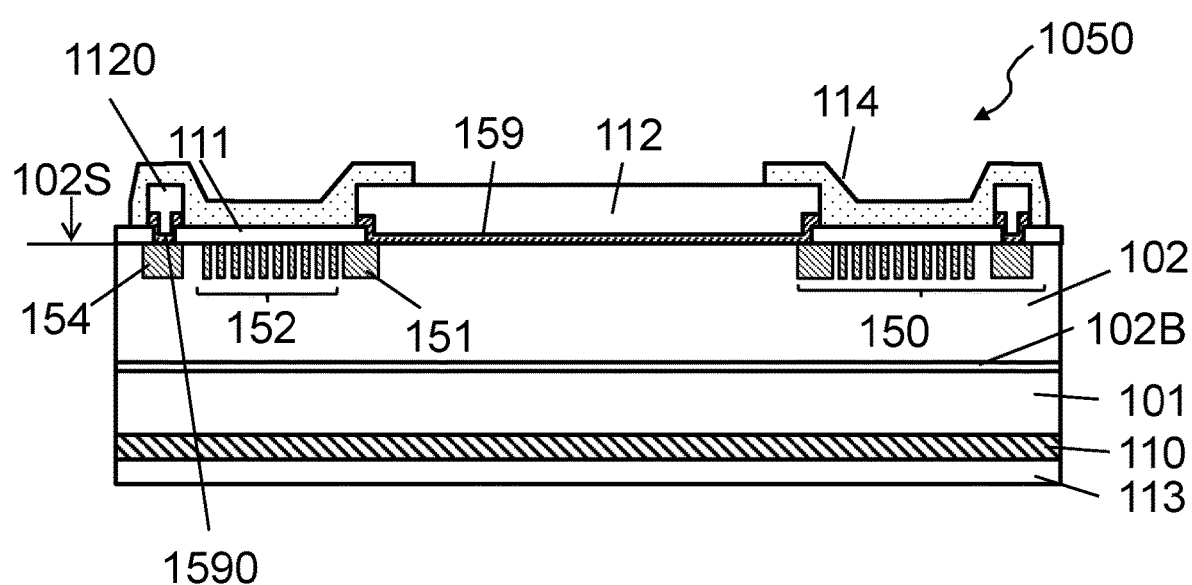
FIG. 22 is a sectional view of a semiconductor device according to a third different example of the present disclosure.
Figure 23:
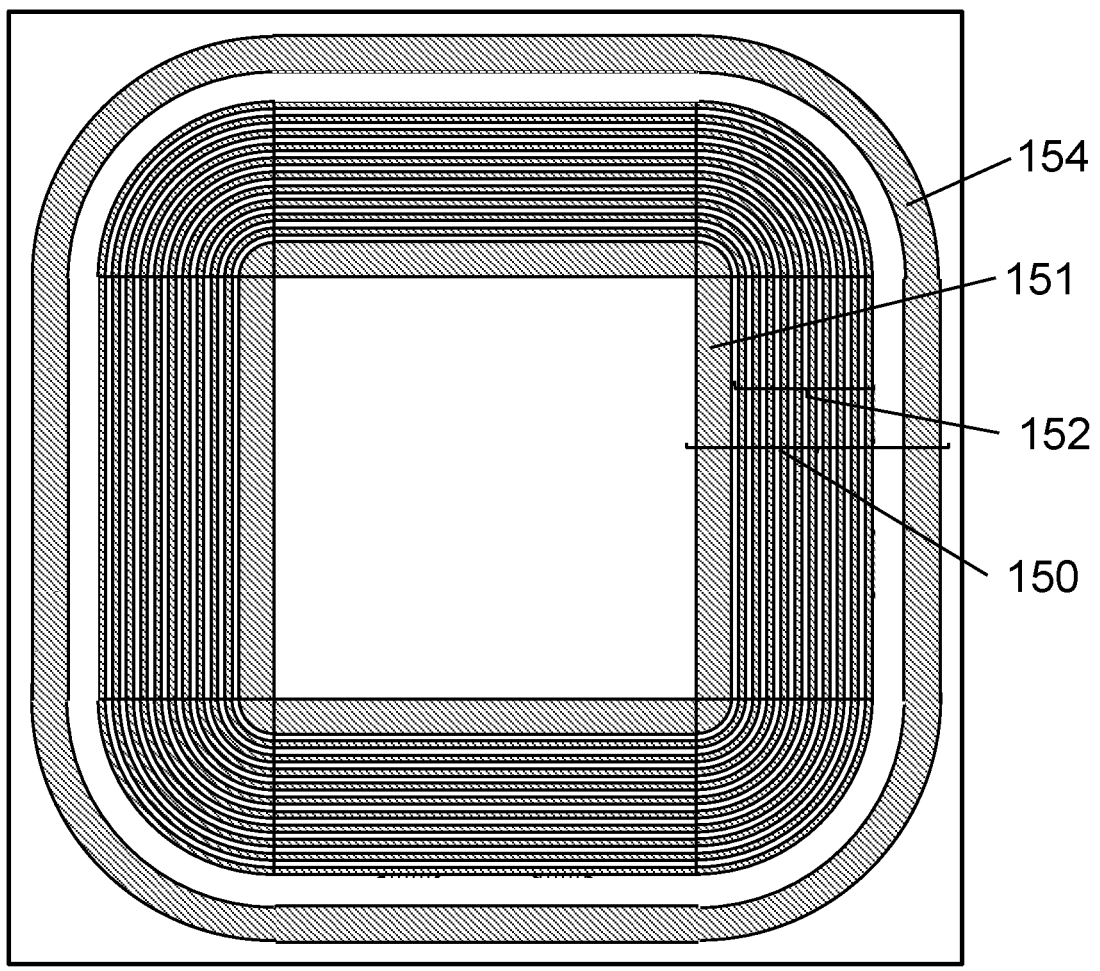
FIG. 23 is a view of an implanted region in a surface of a drift layer in the semiconductor device according to the third different example of the present disclosure.

FIG. 22 and FIG. 23 depict semiconductor device 1050 provided with no barrier regions 153. Reliability can be secured also in this case by disposition of passivation film 114 as depicted in FIG. 3.

Figure 24:
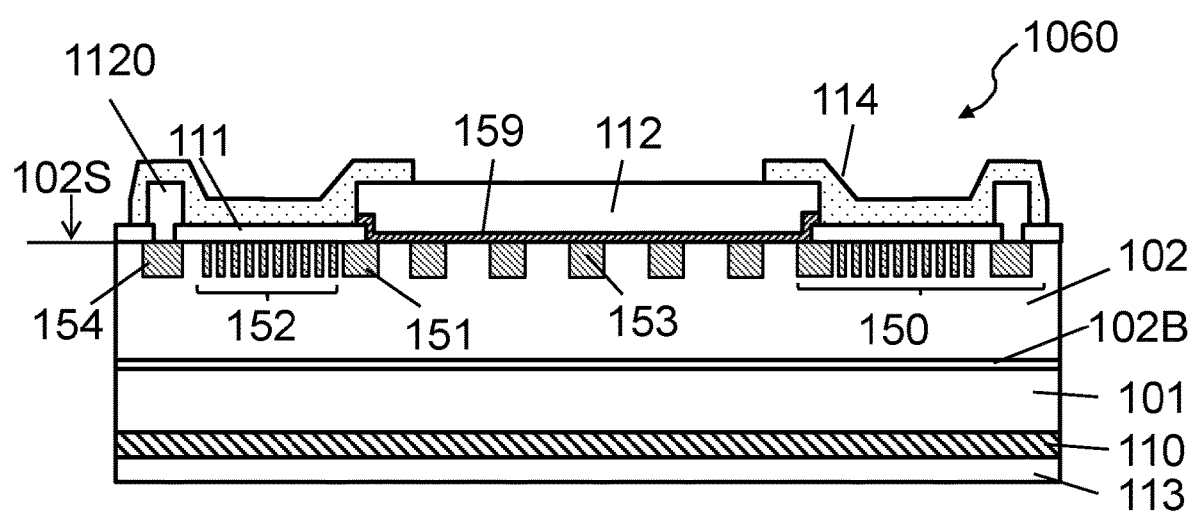
FIG. 24 is a sectional view of a semiconductor device according to a fourth different example of the present disclosure.

FIG. 24 depicts semiconductor device 1060 including no barrier metal 1590 below seal ring 1120 that is in direct contact with terminal implanted region 154. Reliability can be secured also in this case by disposition of passivation film 114 as depicted in FIG. 3.

Figure 25:
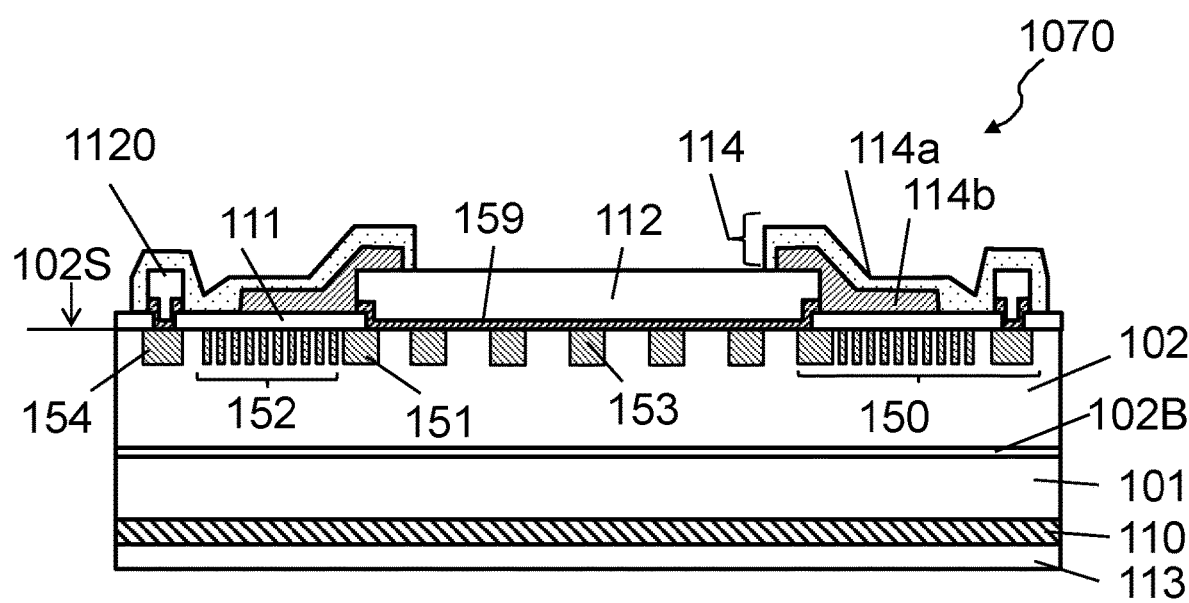
FIG. 25 is a sectional view of a semiconductor device according to a fifth different example of the present disclosure.

As depicted in FIG. 25, passivation film 114 may have a multilayered structure. FIG. 25 depicts semiconductor device 1070 provided with passivation film 114 that includes first passivation film 114a and second passivation film 114b. First passivation film 114a is exemplarily provided as an organic protective film made of polyimide, whereas second passivation film 114b is made of SiN or the like. Second passivation film 114b may be smaller than first passivation film 114a. Second passivation film 114b thus configured may cover at least part of termination region 150 via insulating film 111. Second passivation film 114b may cover part of an upper surface of front surface electrode 112 or an end surface of front surface electrode 112. The passivation film depicted in FIG. 25 may obviously be replaced with the passivation film depicted in any one of FIG. 1 to FIG. 24.

The semiconductor device according to the present disclosure has the FLR region as part of a terminal structure, but is not limited to this case. The FLR region may be replaced with a JTE region having concentration of the second conductivity type gradually decreased from a center toward an end in the plane of the semiconductor substrate. In this case, the JTE region may be in contact with the guard ring region disposed inside, or may be in contact with the terminal implanted region disposed outside.

The semiconductor device according to the present disclosure is not limited to the above exemplification in terms of the configuration and each of the constituent devices. For example, the material for first electrode 159 is not limited to Ti, Ni, and Mo exemplified above. First electrode 159 may be made of any material selected from a group consisting of any other metal forming a Schottky contact with drift layer 102, as well as alloys of the metal and compounds of the metal.

There may be provided a barrier film containing TiN or the like between first electrode 159 and front surface electrode 112. The barrier film is 50 nm or the like in thickness.

The exemplary embodiment of the present disclosure provides the semiconductor device configured as a Schottky diode. However, the present disclosure is not limited to this case. Passivation film 114 according to the present disclosure is provided with the seal ring and is applicable to a semiconductor device containing silicon carbide. The semiconductor device may be a MISFET having a terminal structure provided inside the seal ring and keeping breakdown voltage, as well as a plurality of unit cells configured to switch on an off current.

The exemplary embodiment of the present disclosure provides 4H—SiC as silicon carbide, which may alternatively be of a different polytype such as 6H—SiC, 3C—SiC, or 15R—SiC. The exemplary embodiment of the present disclosure provides the case where the principal surface of a SiC substrate is obtained through off-cutting from a (0001) plane. The principal surface of the SiC substrate may alternatively be a (11-20) plane, a (1-100) plane, a (000-1) plane, or be obtained through off-cutting from any one of these planes. Semiconductor substrate 101 may be provided as a Si substrate. There may be provided a 3C—SiC drift layer on the Si substrate. In this case, annealing for activation of impurity ions implanted in 3C—SiC may be executed at temperature less than or equal to a melting point of the Si substrate.

The present disclosure is applicable to a power semiconductor device mounted in a power converter for consumer use, to be mounted on a vehicle, or for industrial equipment.

What is claimed is:

1. A semiconductor device comprising:
   a semiconductor substrate of a certain conductivity type, having a principal surface and a rear surface positioned opposite to the principal surface;
   a silicon carbide semiconductor layer of a certain conductivity type, disposed on the principal surface of the semiconductor substrate;
   a termination region disposed in the silicon carbide semiconductor layer and surrounding a center region in the silicon carbide semiconductor layer;
   an insulating film covering part of the termination region and exposing remaining part of the termination region;
   a first electrode disposed on at least part of the center region in the silicon carbide semiconductor layer;
   a second electrode disposed on the rear surface of the semiconductor substrate, the second electrode and the semiconductor substrate forming an ohmic contact;
   a seal ring disposed on the remaining part of the termination region and surrounding the first electrode; and
   a passivation film covering at least part of the insulating film and at least part of the seal ring, and including an organic film;
   wherein
   when viewed in a direction perpendicular to the principal surface,
   the passivation film has an outer peripheral end surrounding an outer peripheral end of the seal ring,
   the silicon carbide semiconductor layer has a quadrilateral shape, and
   L1>L2, and
   R1≥L2 are satisfied
   where L2 is a distance from the outer peripheral end of the seal ring to the outer peripheral end of the passivation film at a side of the quadrilateral shape of the silicon carbide semiconductor layer,
   L1 is a distance from the outer peripheral end of the seal ring to the outer peripheral end of the passivation film at a corner of the quadrilateral shape of the silicon carbide semiconductor layer, and
   R1 is a radius of curvature of the outer peripheral end of the passivation film at the corner of the silicon carbide semiconductor layer satisfy.

2. The semiconductor device according to claim 1, wherein the distance L2 is from 5 µm to 25 µm inclusive.

3. The semiconductor device according to claim 1, wherein at the corner of the silicon carbide semiconductor layer viewed in the direction perpendicular to the principal surface, the outer peripheral end of the passivation film has a center of curvature positioned in a region surrounded with the outer peripheral end of the seal ring.

4. The semiconductor device according to claim 1, wherein
   at the corner viewed in the direction perpendicular to the principal surface, the seal ring has an outer peripheral end having a radius of curvature R5, and
   R1<R5 is satisfied.

5. The semiconductor device according to claim 1, wherein the seal ring includes a metal.

6. The semiconductor device according to claim 5, wherein a front surface electrode including a same metal as a metal included in the seal ring is provided on the first electrode.

7. The semiconductor device according to claim 1, wherein the first electrode and the silicon carbide semiconductor layer form a Schottky junction.

* * * * *